United States Patent
Muff et al.

(10) Patent No.: US 7,351,072 B2
(45) Date of Patent: Apr. 1, 2008

(54) MEMORY MODULE, MEMORY EXTENSION MEMORY MODULE, MEMORY MODULE SYSTEM, AND METHOD FOR MANUFACTURING A MEMORY MODULE

(75) Inventors: Simon Muff, Mering (DE); Siva Raghuram, Germering (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/481,676

(22) Filed: Jul. 6, 2006

(65) Prior Publication Data

US 2007/0015381 A1 Jan. 18, 2007

(51) Int. Cl.
*H05K 1/14* (2006.01)

(52) U.S. Cl. .................. 439/74; 361/785; 361/784; 361/790; 361/803; 228/180.21; 228/180.22

(58) Field of Classification Search .................. 439/74; 361/785, 784, 790, 803; 228/180.21, 180.22
See application file for complete search history.

(56) References Cited

U.S. PATENT DOCUMENTS

| | | | | |
|---|---|---|---|---|
| 4,683,550 A | * | 7/1987 | Jindrick et al. | 708/140 |
| 5,611,057 A | * | 3/1997 | Pecone et al. | 710/301 |
| 5,910,885 A | * | 6/1999 | Gulachenski et al. | 361/774 |
| 6,109,929 A | * | 8/2000 | Jasper | 439/74 |
| 6,222,739 B1 | | 4/2001 | Bhakta et al. | |
| 6,324,071 B2 | | 11/2001 | Weber et al. | |
| 6,416,333 B1 | * | 7/2002 | Hasegawa et al. | 439/74 |
| 6,418,034 B1 | * | 7/2002 | Weber et al. | 361/790 |
| 6,705,877 B1 | * | 3/2004 | Li et al. | 439/74 |
| 6,721,189 B1 | * | 4/2004 | Haba | 361/792 |
| 6,721,195 B2 | * | 4/2004 | Brunelle et al. | 365/63 |
| 6,913,471 B2 | * | 7/2005 | Smith | 439/74 |

* cited by examiner

*Primary Examiner*—Gary F. Paumen
(74) *Attorney, Agent, or Firm*—Dicke, Billig & Czaja, PLLC

(57) ABSTRACT

A memory extension memory module, a memory module system, and a memory module is disclosed. The memory module including at least one memory device and a connector for connecting the memory module to a computer system, wherein the memory module additionally includes a surface-mounted connector for connecting a memory extension memory module to the memory module. Furthermore, a method for manufacturing a memory module is disclosed. The memory module including at least one memory device and at least one connector for connecting a memory extension memory module to the memory module, wherein the at least one memory device and the at least one connector are connected to the memory module in a single manufacturing process.

31 Claims, 14 Drawing Sheets

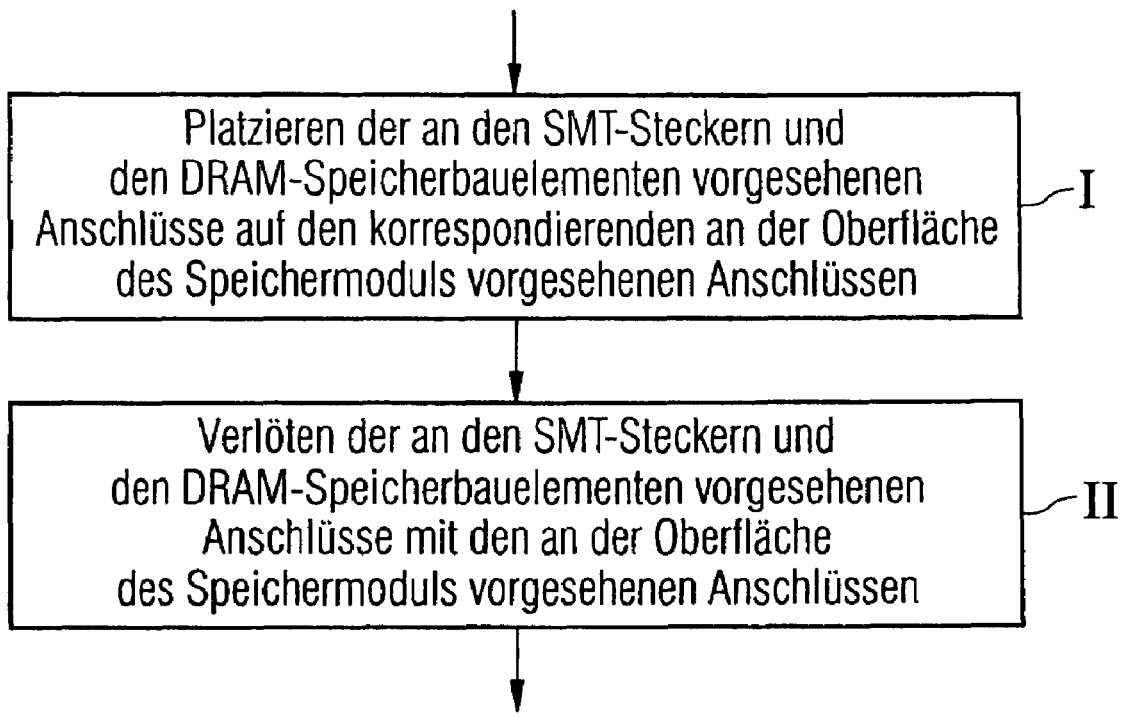

MEMORY MODULE, MEMORY EXTENSION MEMORY MODULE, MEMORY MODULE SYSTEM, AND METHOD FOR MANUFACTURING A MEMORY MODULE

CROSS-REFERENCE TO RELATED APPLICATIONS

This Utility Patent Application claims priority to German Patent Application No. DE 10 2005 032 061.9 filed on Jul. 8, 2005, which is incorporated herein by reference.

FIELD OF THE INVENTION

The invention relates to a memory module, a memory extension memory module, a memory module system, and a method for manufacturing a memory module.

BACKGROUND

Conventional computers, e.g., PCs (Personal Computers), laptops, notebooks, workstation computers, server computers, etc., in general include a main printed circuit board, the motherboard, on which one or a plurality of CPUs may be provided, as well as one or a plurality of plug-in contacts for memory modules, and possibly appropriate BIOS components, coprocessors, cache memory devices, oscillators, and one or a plurality of further plug-in contacts for (further) plug-in cards, etc.

The different components of the motherboard, e.g., the above-mentioned memory modules, the CPU, etc. may—for exchanging corresponding data, address, and/or control signals—be connected with one another via one or a plurality of bus systems.

As memory modules—that are to be inserted into the above-mentioned memory plug-in contacts—appropriate SIMM or DIMM memory cards may, for instance, be used (SIMM=Single In-Line Memory Module, DIMM=Dual In-Line Memory Module), each of them comprising a plurality of memory devices, e.g., a plurality of DRAM memory devices (DRAM=Dynamic Random Access Memory).

In the case of SIMM memory cards, the memory devices are provided only on one single side of the memory card and, in the case of DIMM memory cards, both on the rear side and on the front side of the card (i.e. on both sides).

SIMM memory cards include a connector with, e.g., 72 contacts to be inserted into a corresponding memory module plug-in contact, and DIMM memory cards include a connector with, e.g., 168 contacts, 84 at each side of the card, or, e.g., with 184, 200, 214, or 240 contacts.

Each DRAM memory device that is provided on a corresponding memory card may, for instance, have a storage capacity of 128 MBit, 256 MBit, 512 MBit, or 1 GBit, etc.; the total storage capacity provided by a corresponding memory card depends on the number of DRAM memory devices provided on a memory card, and on the storage capacity of the individual DRAM memory devices, and is, for instance, 1 GByte, 2 GByte, etc.

For DRAM memory devices, various kinds of housings are used, e.g., appropriate surface-mountable housings (SMD housings (SMD=Surface Mounted Device)), or plug-mountable housings (e.g., appropriate DIL housings (DIL=Dual-In-Line), etc.).

In the case of DIL housings, contacts provided at the memory device housing are inserted into corresponding holes provided in the memory card, and the contacts are soldered at the rear side of the card.

Contrary to that, in the case of SMD housings, e.g., in the case of BGA or TSOP housings, contacts provided at the memory device housing are placed on contacts provided on the surface of the memory card—or in more detail on a soldering paste provided there. Thereafter, the memory card is heated in an oven such that the contacts of the memory device are soldered to the corresponding contacts provided on the surface of the memory card.

By the fact that the memory device housings are not soldered directly onto the motherboard, but onto the above-mentioned memory cards—that can be inserted into corresponding plug-in contacts of the motherboard—, the total storage capacity that is provided for the respective computer may be adapted to the respective requirements of the user without major efforts.

The demands made on the storage capacity of computers are continuously increasing.

In order to do justice to these demands, DRAM memory devices with ever increasing storage capacities have been used. At the same time, the number of DRAM memory devices provided on an individual memory card has been increasing.

The number of DRAM memory devices that may maximally be provided on a corresponding memory card is, however, limited by the physical dimension of memory cards which is predetermined by standards.

To increase the storage capacity of a memory card, memory device housings may be used in which—instead of one single memory device—two or more memory devices are arranged, e.g., on top of each other or in a stacked manner, respectively.

For further increasing the storage capacity of a memory card, a memory extension memory card may also be used which may, for instance, be mechanically mounted on a corresponding (main) memory card by means of appropriate screw connections or soldered connections, and which may—for the exchange of data, address, and/or control signals between the main card and the extension memory card—be electrically connected with the main memory card by means of a ribbon cable.

However, inter alia, the relatively high production costs are of disadvantage.

Further disadvantages and limitations of conventional systems and methods will become apparent to a person skilled in the art when comparing such systems and methods with the present invention as set forth in the remainder of the present application with reference to the drawings.

For these and other reasons, there is a need for the present invention.

SUMMARY

The present invention provides a system and method, such as, e.g., a memory module, a memory extension memory module, a memory module system, and a method for manufacturing a memory module and a memory extension memory module.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 14 illustrates a flowchart for illustrating method processes performed during the manufacturing of a memory module or an extension memory module illustrated in FIGS. 2 to 13.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
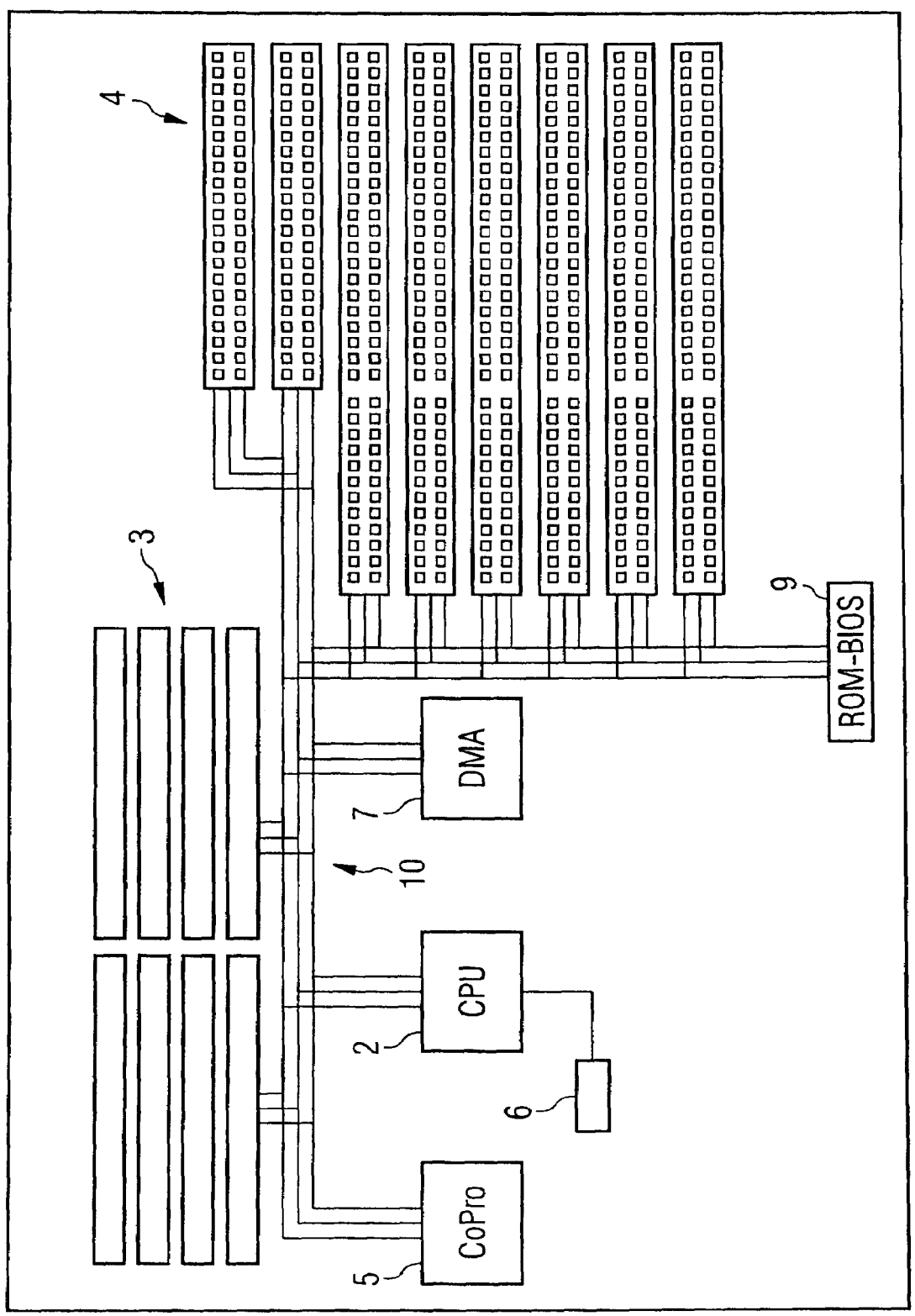
FIG. 1 illustrates a schematic, exemplary representation of a motherboard of a computer into which a memory module according to an embodiment of the present invention may be inserted.

Referring to FIG. 1 there is illustrated a schematic, exemplary representation of a motherboard 1 of a conventional PC (Personal Computer).

The motherboard 1 typically includes a CPU 2 as well as a plurality of plug-in contacts 3 for memory modules, a plurality of further plug-in contacts 4 for (further) plug-in cards, a coprocessor component 5, an oscillator 6, a DMA component 7 (DMA=Direct Memory Access), a ROM-BIOS component 9 (ROM=Read Only Memory; BIOS=Basic Input Output System), and a plurality of cache memory elements.

As results from FIG. 1, several components of the motherboard 1—, e.g., the CPU 2, the memory module plug-in contacts 3, the further plug-in contacts 4, etc.—are connected with each other via one or a plurality of bus systems with corresponding data, address, and/or control busses, e.g., via a PCI bus system 10 (PCI=Peripheral Component Interconnect).

In line with the requirements of the user, one or a plurality of plug-in cards, e.g., a graphic card, a modem card, a sound card, etc., may be inserted into the further plug-in contacts 4.

Each memory module plug-in contact 3 may have a correspondingly similar or identical design as a conventional memory module plug-in contact, in particular such a design that a conventional memory module can be installed in a corresponding memory module plug-in contact 3, e.g., a conventional DIMM memory card with, e.g., 240 contacts (or, alternatively, DIMM memory cards with a different number of contacts, e.g., with 184, 200, or 214 contacts, or, e.g., SIMM memory cards, etc.), such that the contacts of the DIMM or SIMMM memory card, respectively, electrically contact corresponding contacts of the memory module plug-in contact 3 after the installation.

Preferably—instead of a conventional memory module—one of the memory modules 100, 200, 300, 400, 500, 600 according to the embodiments of the invention illustrated in FIGS. 2 to 13 and explained in detail further below is inserted into one, or a plurality of, or all of the above-mentioned memory module plug-in contacts 3. In case not all the memory module plug-in contacts 3 should be occupied with the memory modules 100, 200, 300, 400, 500, 600 illustrated in FIGS. 2 to 13, the remaining memory module plug-in contacts 3 may remain unused, or may be used for conventional memory modules.

Figure 2:
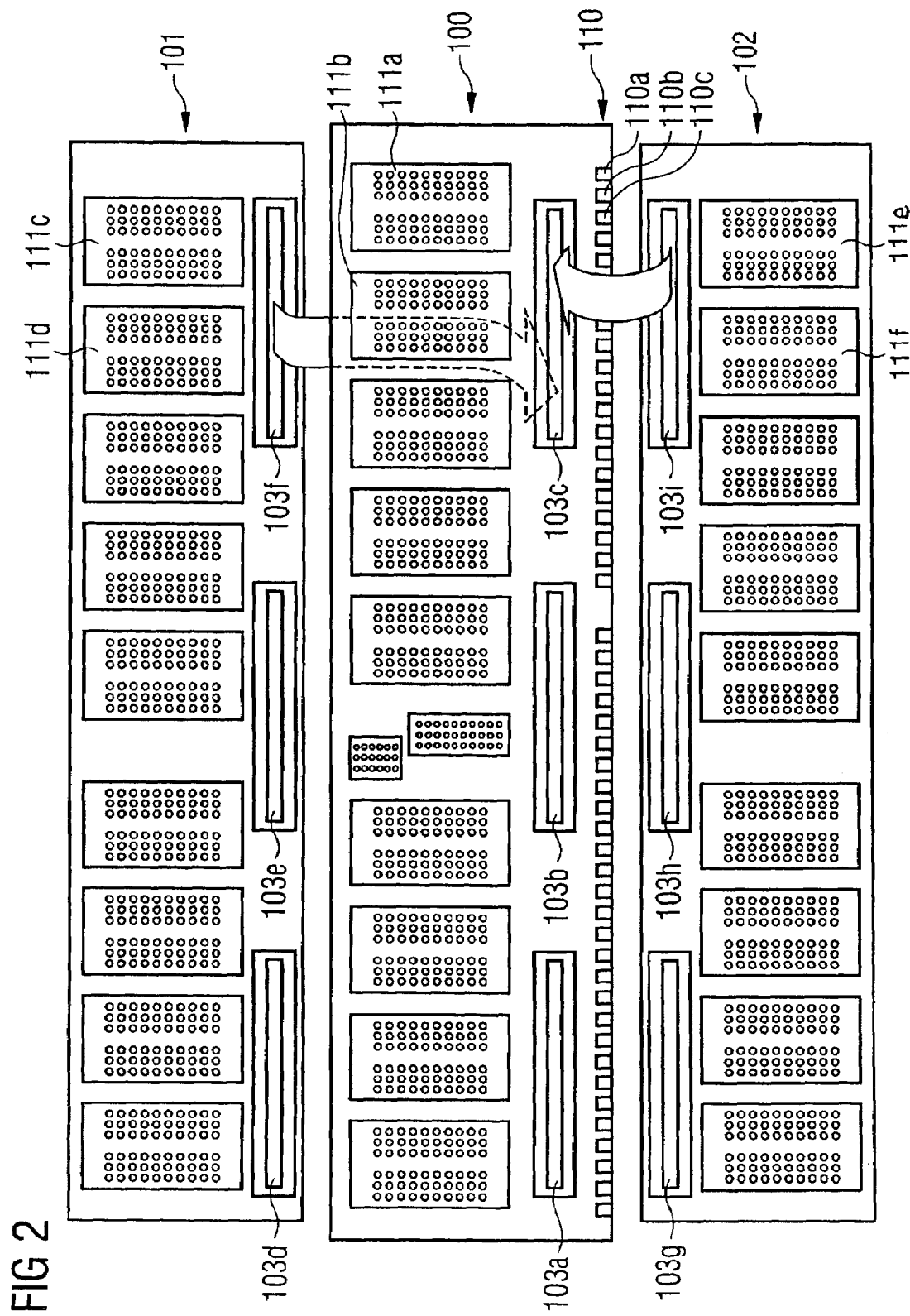
FIG. 2 illustrates a front side of a memory module, a front side of a first extension memory module, and a rear side of a second extension memory module, according to a first embodiment of the invention, in a dismounted state of the first and second extension memory modules.

FIG. 2 illustrates a front side of a memory module 100 or of a printed circuit board/a memory card 100, respectively, according to a first embodiment of the invention, which is adapted to be inserted—in vertical direction from the top—into a memory module plug-in contact 3 of the motherboard 1 illustrated in FIG. 1.

As results from FIG. 2, the memory module 100 includes—correspondingly identical to conventional DIMM memory cards (or, alternatively: to conventional SIMM memory cards)—a plug-in contact 110 (here: a printed circuit board edge connector) at a lower module edge, which may, correspondingly identical as with conventional DIMM memory cards, include—corresponding to the number of contacts of the memory module plug-in contacts 3—, e.g., 240 contacts 110a, 110b, 110c (or, alternatively, e.g., 184, 200, or 214 contacts, etc.).

The plug-in contact 110 of the memory module 100 is designed such that, after the installation of the memory module 100 in one of the plug-in contacts 3 of the motherboard 1, the contacts 110a, 110b, 110c of the plug-in contact 110 of the memory module 100 electrically contact corresponding contacts of the memory module plug-in contact 3 of the motherboard 1.

The outer dimensions of the memory module 100 may be correspondingly similar or identical to conventional DIMM memory cards (or, alternatively: to conventional SIMM memory cards). The memory module 100 may, for instance, have a height of between 2 cm and 10 cm and a length of between 4 cm and 20 cm, etc.

The memory module 100 includes—also correspondingly identical or similar to conventional DIMM memory cards (or, alternatively: to conventional SIMM memory cards)—a plurality of memory devices 111a, 111b, e.g., a plurality of RAM memory devices, in particular DRAM memory devices (RAM=Random Access Memory; DRAM=Dynamic Random Access Memory).

The memory devices 111a, 111b are—corresponding to conventional DIMM memory cards—positioned both at the front side and at the rear side of the memory module 100 (or, alternatively—corresponding to SIMM memory cards—only on one single side of the memory module).

As results from FIG. 2, the memory devices 111a, 111b may be arranged side by side in a horizontal row at the front side and at the rear side of the memory module 100.

Each of the memory devices 111a, 111b provided on the memory module 100 may, for instance, have a storage capacity of, e.g., 128 MBit, 256 MBit, 512 MBit, 1 GBit, or 2 Gbit, etc., so that a total storage capacity of, e.g., 1 GByte, 2 GByte, 4 GByte, etc. is provided by the memory module 100 altogether, depending on the number of memory devices 111a, 111b provided on the memory module 100, and on the storage capacity of the individual memory devices 111a, 111b.

The DRAM memory devices 111a, 111b provided on the memory module 100 may, for instance, all have an identical storage capacity; alternatively, different storage capacities are also conceivable. Each of the DRAM memory devices 111a, 111b arranged at the front side of the memory module 100 may, for instance, have a first storage capacity, and each of the DRAM memory devices arranged at the rear side of the memory module 100 may have a second storage capacity differing therefrom.

In one embodiment, the memory devices 111a, 111b are each arranged in housings that are mounted on the memory module 100 by means of surface-mounting (SMD housings (SMD=Surface Mounted Device)), e.g., in BGA or TSOP housings. Alternatively, memory device housings that are mounted on the memory module 100 by means of plug-in mounting (e.g., DIL housings (DIL=Dual-In-Line), etc.), may also be used.

As memory device housings, there may be used housings in which one single memory device each is arranged, or—and this is of particular advantage—in which, instead of one single memory device, two or more memory devices are arranged, e.g., on top of each other or in a stacked manner, respectively (in the case of DRAM memory devices, "stacked DRAMs" may thus be used preferably).

As results from FIG. 2, in the case of the memory module 100—other than with conventional DIMM memory cards—several additional, specific connectors 103a, 103b, 103c are arranged at the memory module front side and rear side between the memory devices 111a, 111b—that are arranged side by side in a row—and the plug-in contact 110 that extends substantially over the entire length of the lower module edge.

In the present embodiment, three additional connectors 103a, 103b, 103c are provided both at the front side and at the rear side of the memory module 100; alternatively, a larger or smaller number of additional connectors is also conceivable, e.g., only one or two, or also even more than three connectors per side.

The additional connectors 103a, 103b, 103c are positioned at the front side and at the rear side of the memory module 100 side by side in a horizontal row and are spaced apart equidistantly.

Each of the connectors 103a, 103b, 103c provided at the front side of the memory module is positioned to oppose a corresponding connector provided at the rear side of the memory module.

As additional connectors 103a, 103b, 103c, SMT connectors (SMT=Surface Mounted Technique) are preferably used, e.g., MEZZANINE connectors which are—as will be explained in more detail further below—mounted on the memory module 100 by means of surface mounting.

As results from FIG. 2, the SMT connectors 103a, 103b, 103c each have a substantially rectangular, elongate shape and are each attached to the memory module 100 in horizontal orientation (so that the longitudinal axis of the SMT connectors 103a, 103b, 103c extends in parallel to the lower module edge of the memory module 100).

The total number of contacts of the SMT connectors 103a, 103b, 103c that are attached to the front side of the memory module 100 (and correspondingly also of the SMT connectors at the rear side of the memory module) corresponds to the number of contacts of the plug-in contact 110 (here: of the printed circuit board edge connector 110 of the memory module 100), or to the number of contacts of the memory module plug-in contacts 3 of the motherboard 1, respectively, or is higher. For example, 240 contacts (or, alternatively, e.g., 184, 200, or 214 contacts, etc.) are conceivable.

Each SMT connector 103a, 103b, 103c of the memory module 100 is designed such that, after the mounting of the respective SMT connector 103a, 103b, 103c on the memory module 100, the contacts of the respective SMT connector 103a, 103b, 103c electrically contact corresponding contacts provided on the surface of the memory module 100.

If the storage capacity of the memory module 100 is to be increased, in accordance with the first embodiment of the invention a first and/or a second extension memory module 101, 102, or a first and/or a second extension memory printed circuit board/extension memory card 101, 102, respectively, may be used—as will be explained in more detail in the following with respect to FIGS. 2 and 3.

FIG. 2 illustrates a front side of the first extension memory module 101 and a rear side of the second extension memory module 102.

The extension memory modules 101, 102 each include—correspondingly identical or similar to conventional DIMM or SIMM memory cards, and correspondingly similar or identical to the memory module 100 illustrated in FIG. 2—a plurality of memory devices 111c, 111d, or 111e, 111f, respectively, e.g., a plurality of RAM memory devices, in particular DRAM memory devices.

The memory devices 111c, 111d, or 111e, 111f, respectively, each are—corresponding to conventional DIMM memory cards and to the memory module 100 illustrated in FIG. 2—arranged both at the front side and at the rear side of the extension memory modules 101, 102 (or, alternatively—corresponding to SIMM memory cards—only on one single side of the respective extension memory module).

As results from FIG. 2, the memory devices 111c, 111d, or 111e, 111f, respectively, may be arranged side by side in a horizontal row at the front side and at the rear side of the respective extension memory module 101, 102.

Each one of the memory devices 111c, 111d, or 111e, 111f, respectively, provided on the extension memory modules 101, 102 may, for instance, have a storage capacity of, e.g., 128 MBit, 256 MBit, 512 MBit, 1 GBit, or 2 Gbit, etc., so that a total storage capacity of, e.g., 1 GByte, 2 GByte, 4 GByte, etc. is provided by each extension memory module 101, 102, depending on the number of memory devices 111c, 111d, or 111e, 111f, respectively, provided on the respective extension memory module 101, 102, and on the storage capacity of the individual memory devices 111c, 111d, or 111e, 111f, respectively.

The DRAM memory devices 111c, 111d, or 111e, 111f, respectively, provided on the extension memory modules 101, 102 may, for instance, all have an identical storage capacity; alternatively, different storage capacities are also conceivable. Each of the DRAM memory devices 111c, 111d, or 111e, 111f, respectively, arranged at the front side of the first extension memory module 101 and at the rear side of the second extension memory module 102 may, for instance, have a first storage capacity, and each of the DRAM memory devices arranged at the rear side of the first extension memory module 101 and at the front side of the second extension memory module 102 may have a second storage capacity differing therefrom.

In one embodiment, the memory devices 111c, 111d, or 111e, 111f, respectively, are each arranged in housings that are mounted on the extension memory modules 101, 102 by means of surface-mounting (SMD housings), e.g., in BGA or TSOP housings. Alternatively, memory device housings that are mounted on the extension memory modules 101, 102 by means of plug-in mounting (e.g., DIL housings, etc.), may also be used.

As memory device housings, there may be used housings in which one single memory device each is arranged, or—and this is of particular advantage—in which, instead of one single memory device, two or more memory devices are arranged, e.g., on top of each other or in a stacked manner, respectively (in the case of DRAM memory devices, "stacked DRAMs" may thus be used preferably).

The outer dimensions of the extension memory modules 101, 102 substantially correspond to those of conventional DIMM or SIMM memory cards, or to the memory module 100 illustrated in FIG. 2, respectively. The height (and possibly also the length) is, however, somewhat smaller than with the memory module 100 illustrated in FIG. 2 (the height may, e.g., be by approx. 0.5 cm to 2 cm smaller than with the memory module 100 and may, e.g., be between 1.5 cm and 9 cm, with a length of between, e.g., 4 cm and 18 cm, etc.).

As results further from FIG. 2, the extension memory modules 101, 102 do—other than conventional DIMM or SIMM memory cards and the memory module 100 illustrated in FIG. 2—not include any printed circuit board edge connector provided at a lower module edge.

Instead, at the front side of the extension memory module 101 and at the rear side of the extension memory module 102, there are provided a plurality of specific connectors 103d, 103e, 103f, or 103g, 103h, 103i, respectively, that take over the function of printed circuit board edge connectors of conventional DIMM or SIMM memory cards, and that will be explained in more detail in the following.

The number of connectors 103g, 103h, 103i provided at the rear side of the extension memory module 102 corresponds to the number of (additional) connectors 103a, 103b, 103c provided at the front side of the memory module 100, and the number of connectors 103d, 103e, 103f provided at the front side of the extension memory module 101 corresponds to the number of (additional) connectors provided at the rear side of the memory module 100 (here: three, alternatively, e.g., only one or two, or even more than three).

The connectors 103d, 103e, 103f, or 103g, 103h, 103i, respectively, of the extension memory modules 101, 102 are each arranged between the respective memory devices 111c, 111d, or 111e, 111f, respectively—which are each positioned side by side in a row—and the respective lower module edge, in particular side by side in a horizontal row and spaced apart equidistantly.

As connectors 103d, 103e, 103f, or 103g, 103h, 103i, respectively, SMT connectors are preferably used, e.g., MEZZANINE connectors which are—as will be explained in more detail further below—mounted on the respective extension memory module 101, 102 by means of surface mounting.

As results from FIG. 2, the SMT connectors 103d, 103e, 103f, or 103g, 103, 103i, respectively, each have a substantially rectangular, elongate shape and are each attached to the respective extension memory module 101, 102 in horizontal orientation (so that the longitudinal axis of the SMT connectors 103d, 103e, 103f, or 103g, 103h, 103i, respectively, extends in parallel to the respective lower module edge of the extension memory modules 101, 102).

The SMT connector 103g at the rear side of the second extension memory module 102 constitutes the counterpart of the SMT connector 103a at the front side of the memory module 100, the SMT connector 103h at the rear side of the second extension memory module 102 constitutes the counterpart of the SMT connector 103b at the front side of the memory module 100, and the SMT connector 103i at the rear side of the second extension memory module 102 constitutes the counterpart of the SMT connector 103c at the front side of the memory module 100.

Correspondingly similar, the SMT connectors 103d, 103e, 103f at the front side of the first extension memory module 101 each constitute the counterparts of the SMT connectors provided at the rear side of the memory module 100.

Figure 3:
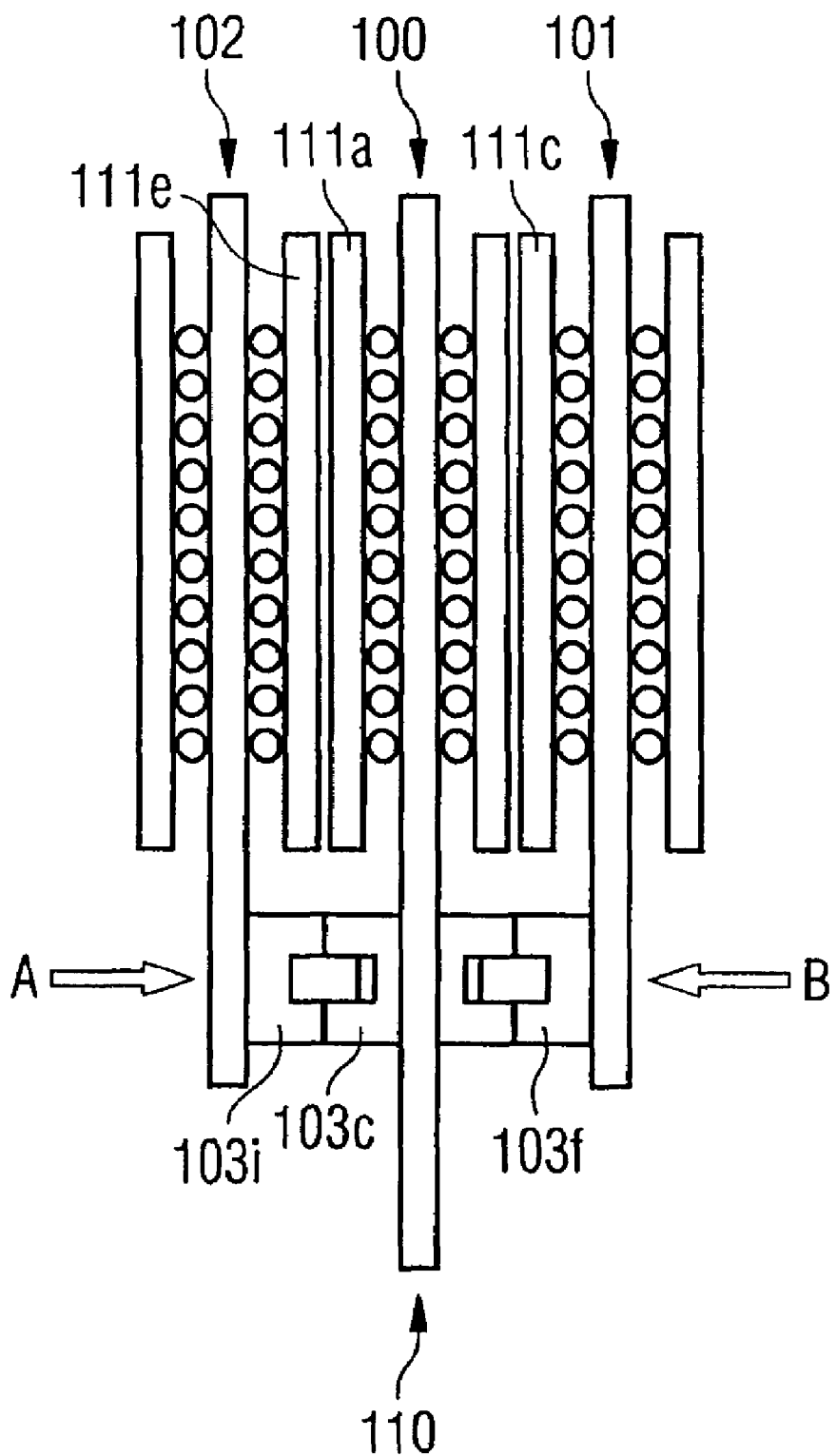
FIG. 3 illustrates a schematic lateral view of the memory modules illustrated in FIG. 2, in a mounted state of the first and second extension memory modules.

If the storage capacity of the memory module 100 is to be increased, the second extension memory module 102 may—as is illustrated in FIG. 3—be moved—from a position at which the rear side of the second extension memory module 102 and the front side of the memory module 100 are directly facing each other in parallel—in horizontal direction (arrow A) towards the memory module 100 until the SMT connector 103g at the rear side of the second extension memory module 102 engages in the corresponding SMT connector 103a at the front side of the memory module 100, the SMT connector 103h at the rear side of the second extension memory module 102 engages in the corresponding SMT connector 103b at the front side of the memory module 100, and the SMT connector 103i at the rear side of the second extension memory module 102 engages in the corresponding SMT connector 103c at the front side of the memory module 100.

The SMT connectors 103a, 103b, 103c, and 103g, 103h, 103i are designed such that, after the engaging of the SMT connectors 103g, 103h, 103i in the SMT connectors 103a, 103b, 103c, the contacts of the SMT connectors 103g, 103h, 103*i* electrically contact the respectively corresponding contacts of the SMT connectors 103*a*, 103*b*, 103*c*. The second extension memory module 102 then is—without any cable—electrically connected with the memory module 100.

Thereby the SMT connectors 103*a*, 103*b*, 103*c* of the memory module 100 may, e.g., represent the female part, and the SMT connectors 103*g*, 103*h*, 103*i* of the extension memory module 102 may, e.g., represent the male part of the connection.

By the engaging of the SMT connectors 103*g*, 103*h*, 103*i* in the SMT connectors 103*a*, 103*b*, 103*c*, it is simultaneously achieved that the second extension memory module 102 and the memory module 100 are mechanically secured from shifting relative to each other, i.e. that the second extension memory module 102 is mechanically connected with the memory module 100 without the necessity of further connections, e.g., appropriate screw connections.

Alternatively or additionally to the extension memory module 102—for (further) increasing the storage capacity of the memory module 100 (e.g., to 12 GByte, etc.), and as is also illustrated in FIG. 3—the first extension memory module 101 may be electrically and mechanically connected with the memory module 100.

To this end, the first extension memory module 101 is—from a position in which the front side of the first extension memory module 101 and the rear side of the memory module 100 are directly facing each other in parallel—moved in horizontal direction (arrow B) towards the memory module 100 until the SMT connectors 103*d*, 103*e*, 103*f* at the front side of the first extension memory module 101 engage in the corresponding SMT connectors at the rear side of the memory module 100.

The SMT connectors 103*d*, 103*e*, 103*f* at the front side of the first extension memory module and the corresponding SMT connectors at the rear side of the memory module 100 are designed such that, after the engaging of the SMT connectors, the contacts of the SMT connectors 103*d*, 103*e*, 103*f* at the front side of the first extension memory module electrically contact the respectively corresponding contacts of the SMT connectors at the rear side of the memory module 100. The first extension memory module 101 then is—without any cable—electrically connected with the memory module 100.

Thereby the SMT connectors of the memory module 100 may, e.g., represent the female part, and the SMT connectors 103*d*, 103*e*, 103*f* of the extension memory module 101 may, e.g., represent the male part of the connection.

By the engaging of the SMT connectors 103*d*, 103*e*, 103*f* at the front side of the first extension memory module in the corresponding SMT connectors at the rear side of the memory module 100, it is simultaneously achieved that the first extension memory module 101 and the memory module 100 are mechanically secured from shifting relative to each other, i.e. that the first extension memory module 101 is mechanically connected with the memory module 100 without the necessity of further connections, e.g., appropriate screw connections.

As results from FIG. 3, after the connection of the extension memory modules 101, 102 with the memory module 100, the upper module edges of the extension memory modules 101, 102 are substantially on the same level as the upper module edge of the memory module 100, and the lower module edges of the extension memory modules 101, 102 are somewhat above the lower module edge of the memory module 100; the extension memory modules 101, 102 are parallel to each other and parallel to the memory module 200.

By the above-explained electrical connection of the extension memory modules 101, 102 with the memory module 100, one or a plurality of bus systems of the extension memory modules 101, 102—which connect the DRAM memory devices 111*c*, 111*d*, or 111*e*, 111*f*, respectively, of the first or second extension memory module, respectively, with the SMT connectors 103*d*, 103*e*, 103*f*, or 103*g*, 103*h*, 103*i*, respectively—is/are connected with one or a plurality of bus systems provided on the memory module 100 (which, for instance, connect the SMT connectors 103*a*, 103*b*, 103*c* with the plug-in contact 110 or printed circuit board edge connector 110, respectively (and possibly additionally also the DRAM memory devices 111*a*, 111*b* of the memory module 100 and the plug-in contact 110 or printed circuit board edge connector 110, respectively)).

It is thus possible that, by means of the CPU 2, data can be stored in any of the DRAM memory devices 111*a*, 111*b*, 111*c*, 111*d*, 111*e*, 111*f* provided on the memory module 100 or the extension memory modules 101, 102, and can be read out again later.

Advantageously, over respective first and second SMT connectors of each of the memory modules 100, 101, 102 (e.g., the SMT connectors 103*a*, 103*c*, 103*d*, 103*f*, 103*g*, 103*i*) corresponding data signals may be transferred, and over a respective third SMT connector of each of the memory modules 100, 101, 102 (e.g., the SMT connectors 103*b*, 103*e*, 103*h*) corresponding control and address signals.

Thereby a respective single contact 110*a*, 110*b*, 110*c* of the edge connector 110 of the memory module 100 may be connected to a corresponding single contact of a corresponding SMT connector of each of the memory modules 100, 101, 102, or—alternatively—to several corresponding contacts of a corresponding SMT connector of each of the memory modules 100, 101, 102. By this, the probability of faults is reduced.

If the storage capacity of the memory module 100 is to be decreased again, the second extension memory module 102 can be impacted, in horizontal direction opposite to the arrow A, with an appropriately high tension force, so that the SMT connectors 103*g*, 103*h*, 103*i* at the rear side of the second extension memory module 102 are pulled out of the corresponding SMT connectors 103*a*, 103*b*, 103*c* at the front side of the memory module 100.

The electrical and mechanical connection between the second extension memory module 102 and the memory module 100 is then broken up again.

Alternatively or additionally, the first extension memory module 101 may be impacted, in horizontal direction opposite to the arrow B, with an appropriately high tension force, so that the SMT connectors 103*d*, 103*e*, 103*f* at the front side of the first extension memory module 101 are pulled out of the corresponding SMT connectors at the rear side of the memory module 100.

The storage capacity of the memory module 100 can thus be changed modularly.

Figure 4:
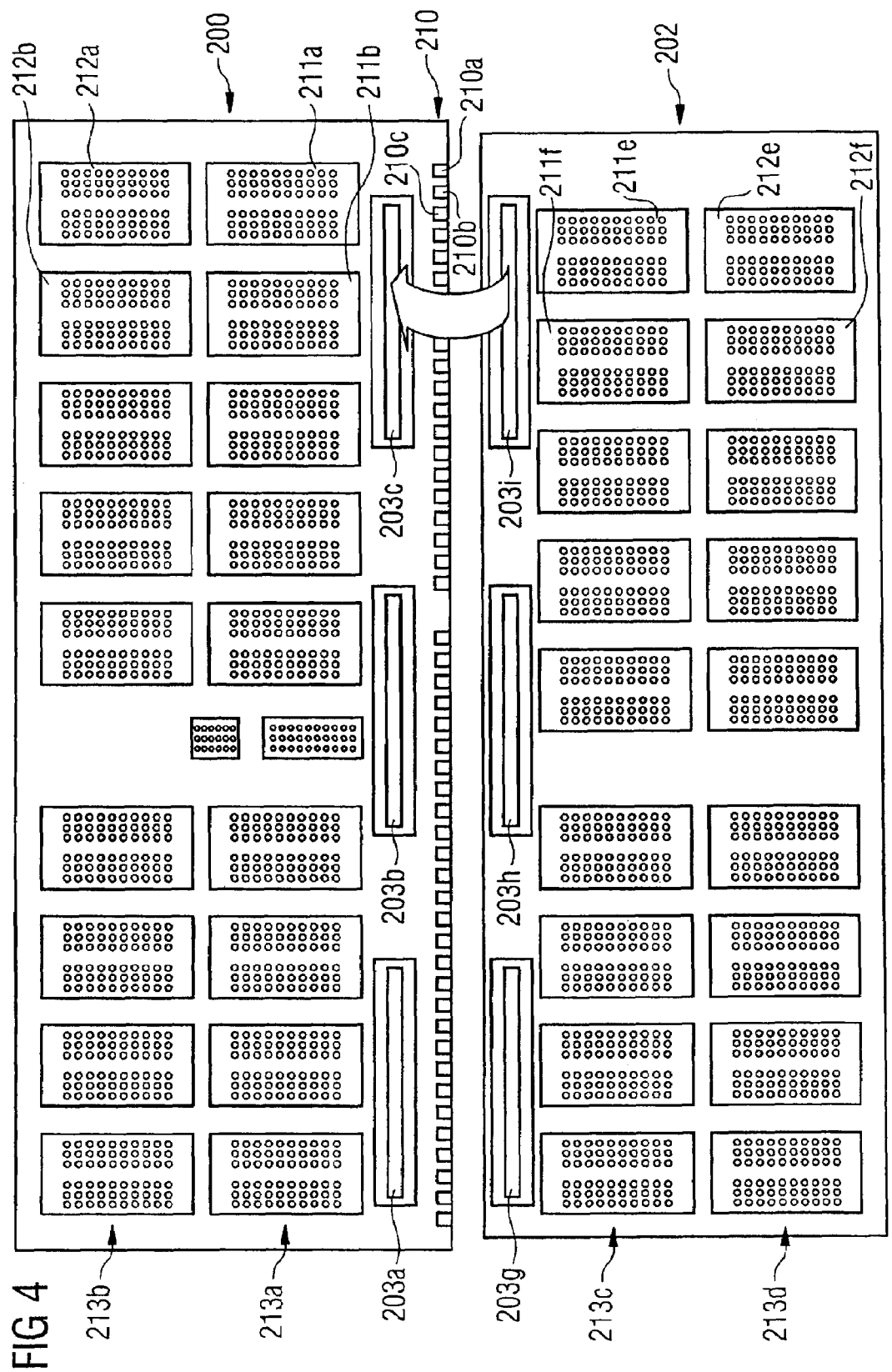
FIG. 4 illustrates a front side of a memory module, and a rear side of an extension memory module, according to a second embodiment of the invention, in a dismounted state of the extension memory module.

FIG. 4 illustrates a front side of a memory module 200 or a printed circuit board 200, respectively, according to a second, alternative embodiment of the invention, which is adapted to be inserted—in vertical direction from the top—into a memory module plug-in contact 3 of the motherboard 1 illustrated in FIG. 1.

As results from FIG. 4, the memory module 200 includes—correspondingly identical to conventional DIMM memory cards (or, alternatively: to conventional SIMM memory cards) a plug-in contact 210 (here: a printed circuit board edge connector) at a lower module edge, which may, correspondingly identical to conventional DIMM memory cards, include, e.g., 240 contacts 210a, 210b, 210c (or, alternatively, e.g., 184, 200, or 214 contacts, etc.), corresponding to the number of contacts of the memory module plug-in contacts 3.

The plug-in contact 210 of the memory module 200 is designed such that, after the installation of the memory module 200 in one of the plug-in contacts 3 of the motherboard 1, the memory module contacts 210a, 210b, 210c of the plug-in contact 210 of the memory module 200 electrically contact corresponding contacts of the memory module plug-in contact 3 of the motherboard 1.

The outer dimensions of the memory module 200 may be correspondingly similar or identical to conventional DIMM memory cards (or, alternatively: to conventional SIMM memory cards). The memory module 200 may, for instance, have a height of between 3 cm and 12 cm, and a length of between 4 cm and 20 cm, etc.

The memory module 200 includes—also correspondingly identical or similar to conventional DIMM memory cards (or, alternatively: to conventional SIMM memory cards)—a plurality of memory devices 211a, 211b, 212a, 212b, e.g., a plurality of RAM memory devices, in particular DRAM memory devices.

The memory devices 211a, 211b, 212a, 212b are—corresponding to conventional DIMM memory cards—positioned both at the front side and at the rear side of the memory module 200 (or, alternatively—corresponding to SIMM memory cards—only on one single side of the memory module).

As results from FIG. 4, the memory devices 211a, 211b, 212a, 212b may be arranged at the front side and at the rear side of the memory module 200 side by side and on top of each other in several horizontal rows that are positioned on top of each other (here: in two rows 213a, 213b positioned on top of each other).

Each one of the memory devices 211a, 211b, 212a, 212b provided on the memory module 200 may, for instance, have a storage capacity of, e.g., 128 MBit, 256 MBit, 512 MBit, 1 GBit, or 2 Gbit, etc., so that a total storage capacity of, e.g., 1 GByte, 2 GByte, 4 GByte, etc. is provided by the memory module 200, depending on the number of memory devices 211a, 211b, 212a, 212b provided on the memory module 200, and on the storage capacity of the individual memory devices 211a, 211b, 212a, 212b.

The DRAM memory devices 211a, 211b, 212a, 212b provided on the memory module 200 may, for instance, all have an identical storage capacity; alternatively, different storage capacities are also conceivable. Each of the DRAM memory devices 211a, 211b, 212a, 212b arranged at the front side of the memory module 200 may, for instance, have a first storage capacity, and each of the DRAM memory devices arranged at the rear side of the memory module 200 may have a second storage capacity differing therefrom.

It is particularly preferred if the memory devices 211a, 211b, 212a, 212b are each arranged in housings that are mounted on the memory module 200 by means of surface-mounting (SMD housings), e.g., in BGA or TSOP housings. Alternatively, memory device housings that are mounted on the memory module 200 by means of plug-in mounting (e.g., DIL housings, etc.), may also be used.

As memory device housings, there may be used housings in which one single memory device each is arranged, or—and this is of particular advantage—in which, instead of one single memory device, two or more memory devices are arranged, e.g., on top of each other or in a stacked manner, respectively (in the case of DRAM memory devices, "stacked DRAMs" may thus be used preferably).

As results from FIG. 4, in the case of the memory module 200—other than with conventional DIMM memory cards—several (here: three) additional, specific connectors 203a, 203b, 203c are arranged at the front side of the memory module between the lower row of memory devices 213a and the plug-in contact 210 that extends substantially over the entire length of the lower module edge.

Alternatively, a larger or smaller number of additional connectors is also conceivable, e.g., only one or two, or even more than three connectors.

The additional connectors 203a, 203b, 203c are arranged side by side in a horizontal row and are spaced apart equidistantly.

As additional connectors 203a, 203b, 203c, SMT connectors (SMT=Surface Mounted Technique) are preferably used, e.g., MEZZANINE connectors which are—as will be explained in more detail further below—mounted on the memory module 200 by means of surface mounting.

As results from FIG. 4, the SMT connectors 203a, 203b, 203c each have a substantially rectangular, elongate shape and are each attached to the memory module 200 in horizontal orientation (so that the longitudinal axis of the SMT connectors 203a, 203b, 203c extends in parallel to the lower module edge of the memory module 200).

The total number of contacts of the SMT connectors 203a, 203b, 203c that are attached to the front side of the memory module 200 corresponds to the number of contacts of the plug-in contact 210 (here: of the printed circuit board edge connector 210 of the memory module 200), or to the number of contacts of the memory module plug-in contacts 3 of the motherboard 1, respectively, or is higher. For example, 240 contacts (or, alternatively, e.g., 184, 200, or 214 contacts, etc.) are conceivable.

Each SMT connector 203a, 203b, 203c of the memory module 200 is designed such that, after the mounting of the respective SMT connector 203a, 203b, 203c on the memory module 200, the contacts of the respective SMT connector 203a, 203b, 203c electrically contact corresponding contacts provided on the surface of the memory module 200.

If the storage capacity of the memory module 200 is to be increased, in accordance with the second embodiment of the invention an extension memory module 202 or extension memory printed circuit board 202, respectively, may be used—as will be explained in more detail in the following with respect to FIGS. 4 and 5.

FIG. 4 illustrates a rear side of the extension memory module 202.

The extension memory module 202 includes—correspondingly identical or similar to conventional DIMM or SIMM memory cards, and correspondingly similar or identical to the memory module 200 illustrated in FIG. 4—a plurality of memory devices 211e, 211f, 212e, 212f, e.g., a plurality of RAM memory devices, in particular DRAM memory devices.

The memory devices 211e, 211f, 212e, 212f are—corresponding to conventional DIMM memory cards and to the memory module 200 illustrated in FIG. 4—arranged both at the front side and at the rear side of the extension memory module 202 (or, alternatively—corresponding to SIMM memory cards—only at one single side of the respective extension memory module).

As results from FIG. 4, the memory devices 211e, 211f, 212e, 212f may be arranged at the front side and at the rear side of the extension memory module 202 side by side and on top of each other in several horizontal rows that are positioned on top of each other (here: in two rows 213c, 213d positioned on top of each other).

Each one of the memory devices 211e, 211f, 212e, 212f provided on the extension memory module 202 may, for instance, have a storage capacity of, e.g., 128 MBit, 256 MBit, 512 MBit, 1 GBit, or 2 Gbit, etc., so that a total storage capacity of, e.g., 1 GByte, 2 GByte, 4 GByte, etc. is provided by the extension memory module 202, depending on the number of memory devices 211e, 211f, 212e, 212f provided on the extension memory module 202, and on the storage capacity of the individual memory devices 211e, 211f, 212e, 212f.

The DRAM memory devices 211e, 211f, 212e, 212f provided on the extension memory module 202 may, for instance, all have an identical storage capacity; alternatively, different storage capacities are also conceivable. Each of the DRAM memory devices arranged at the front side of the extension memory module 202 may, for instance, have a first storage capacity, and each of the DRAM memory devices 211e, 211f, 212e, 212f arranged at the rear side of the extension memory module 202 may have a second storage capacity differing therefrom.

It is particularly preferred if the memory devices 211e, 211f, 212e, 212f are each arranged in housings that are mounted on the extension memory module 202 by means of surface-mounting (SMD housings), e.g., in BGA or TSOP housings. Alternatively, memory device housings that are mounted on the extension memory module 202 by means of plug-in mounting (e.g., DIL housings, etc.), may also be used.

As memory device housings, there may be used housings in which one single memory device each is arranged, or—and this is of particular advantage—in which, instead of one single memory device, two or more memory devices are arranged, e.g., on top of each other or in a stacked manner, respectively (in the case of DRAM memory devices, "stacked DRAMs" may thus be used preferably).

The outer dimensions of the extension memory module 202 substantially correspond to those of conventional DIMM or SIMM memory cards, or to the memory module 200 illustrated in FIG. 4, respectively. The height (and possibly also the length) is, however, somewhat smaller than with the memory module 200 illustrated in FIG. 4 (the height may, e.g., be by approx. 0.5 cm to 2 cm smaller than with the memory module 200 and may, e.g., be between 2 cm and 11 cm, with a length of between, e.g., 4 cm and 18 cm, etc.).

As results further from FIG. 4, the extension memory module 202 does—other than conventional DIMM or SIMM memory cards, and the memory module 200 illustrated in FIG. 4—not include any printed circuit board edge connector provided at a lower module edge.

Instead, at the rear side of the extension memory module 202 there are provided a plurality of specific connectors 203g, 203h, 203i that take over the function of printed circuit board edge connectors of conventional DIMM or SIMM memory cards, and that will be explained in more detail in the following.

The number of connectors 203g, 203h, 203i provided at the rear side of the extension memory module 202 corresponds to the number of (additional) connectors 203a, 203b, 203c provided at the front side of the memory module 200 (here: three, alternatively, e.g., only one or two, or even more than three connectors).

The connectors 203g, 203h, 203i of the extension memory module 202 are each positioned between the row of memory devices 213c and the module edge that is (after the installation of the extension memory module 202) positioned at the bottom, in particular side by side in a horizontal row and spaced apart equidistantly.

As connectors 203g, 203h, 203i, SMT connectors are preferably used, e.g., MEZZANINE connectors, which are—as will be explained in more detail further below—mounted on the extension memory module 202 by means of surface mounting.

As results from FIG. 4, the SMT connectors 203g, 203h, 203i each have a substantially rectangular, elongate shape and are each attached to the extension memory module 202 in horizontal orientation (so that the longitudinal axis of the SMT connectors 203g, 203h, 203i extends in parallel to the above-mentioned module edge of the extension memory module 202 that is positioned at the bottom after the installation of the extension memory module 202).

The SMT connector 203g at the rear side of the extension memory module 202 constitutes the counterpart of the SMT connector 203a at the front side of the memory module 200, the SMT connector 203h at the rear side of the extension memory module 202 constitutes the counterpart of the SMT connector 203b at the front side of the memory module 200, and the SMT connector 203i at the rear side of the extension memory module 202 constitutes the counterpart of the SMT connector 203c at the front side of the memory module 200.

Figure 5:
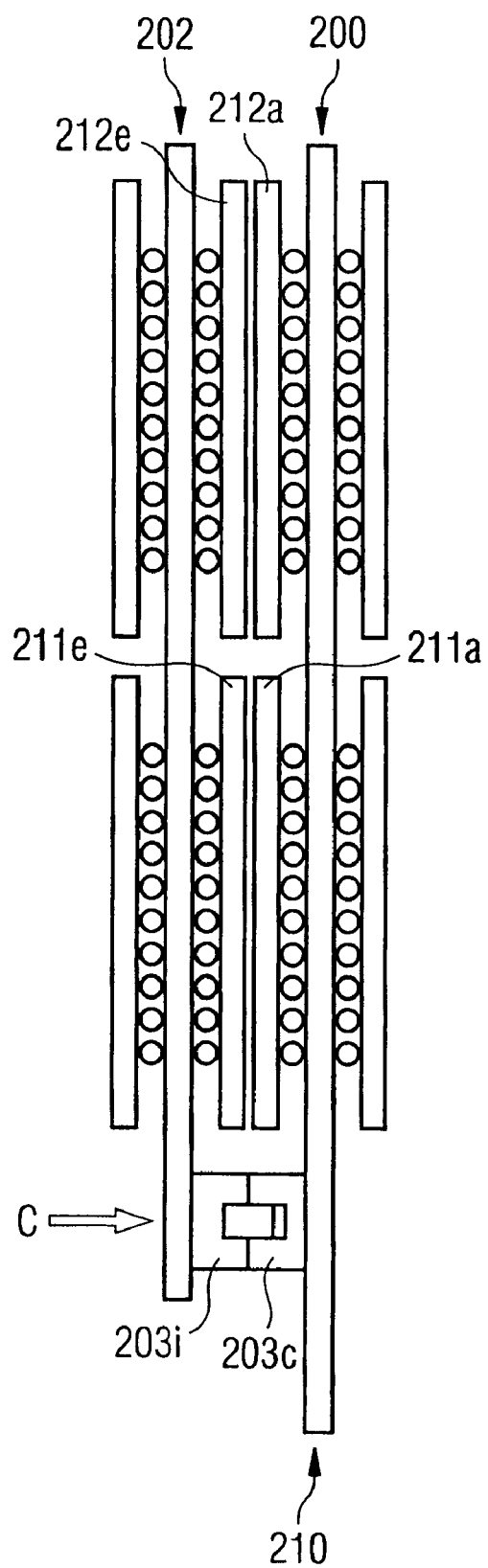
FIG. 5 illustrates a schematic lateral view of the memory modules illustrated in FIG. 4, in a mounted state of the extension memory module.

If the storage capacity of the memory module 200 is to be increased (e.g., to 8 GByte, etc.), the extension memory module 202 may—as is illustrated in FIG. 5—be moved—from a position at which the rear side of the extension memory module 202 and the front side of the memory module 200 are directly facing each other in parallel—in horizontal direction (arrow C) towards the memory module 200 until the SMT connector 203g at the rear side of the extension memory module 202 engages in the corresponding SMT connector 203a at the front side of the memory module 200, the SMT connector 203h at the rear side of the extension memory module 202 engages in the corresponding SMT connector 203b at the front side of the memory module 200, and the SMT connector 203i at the rear side of the extension memory module 202 engages in the corresponding SMT connector 203c at the front side of the memory module 200.

The SMT connectors 203a, 203b, 203c, and 203g, 203h, 203i are designed such that, after the engaging of the SMT connectors 203g, 203h, 203i in the SMT connectors 203a, 203b, 203c, the contacts of the SMT connectors 203g, 203h, 203i electrically contact the respectively corresponding contacts of the SMT connectors 203a, 203b, 203c. The extension memory module 202 then is—without any cable—electrically connected with the memory module 200.

Thereby the SMT connectors 203a, 203b, 203c of the memory module 200 may, e.g., represent the female part, and the SMT connectors 203g, 203h, 203i of the extension memory module 202 may, e.g., represent the male part of the connection.

By the engaging of the SMT connectors 203g, 203h, 203i in the SMT connectors 203a, 203b, 203c, it is simultaneously achieved that the extension memory module 202 and the memory module 200 are mechanically secured from shifting relative to each other, i.e. that the extension memory module 202 is mechanically connected with the memory module 200 without the necessity of further connections, e.g., appropriate screw connections.

As results from FIG. 5, after the connection of the extension memory module 202 with the memory module 200, the upper module edge of the extension memory module 202 is substantially on the same level as the upper module edge of the memory module 200, and the lower module edge of the extension memory module 202 is somewhat above the lower module edge of the memory module 200; the extension memory module 202 is parallel to the memory module 200.

By the above-explained electrical connection of the extension memory module 202 with the memory module 200, one or a plurality of bus systems of the extension memory module 202—that connect the DRAM memory devices 211e, 211f, 212e, 212f of the extension memory module 202 with the SMT connectors 203g, 203h, 203i—is/are connected with one or a plurality of bus systems provided on the memory module 200 (which, for instance, connect the SMT connectors 203a, 203b, 203c with the plug-in contact 210 or printed circuit board edge connector 210, respectively (and possibly additionally also the DRAM memory devices 211a, 211b of the memory module 200 and the plug-in contact 210 or printed circuit board edge connector 210, respectively)).

It is thus possible that, by means of the CPU 2, data can be stored in any of the DRAM memory devices 211a, 211b, 212a, 212b, 211e, 211f, 212e, 212f provided on the memory module 200 or the extension memory module 202, and can be read out later again.

If the storage capacity of the memory module 200 is to be decreased again, the extension memory module 202 can be impacted, in horizontal direction opposite to the arrow C, with an appropriately high tension force, so that the SMT connectors 203g, 203h, 203i at the rear side of the extension memory module 202 are pulled out of the corresponding SMT connectors 203a, 203b, 203c at the front side of the memory module 200.

The electrical and mechanical connection between the extension memory module 202 and the memory module 200 is then broken up again.

Figure 6:
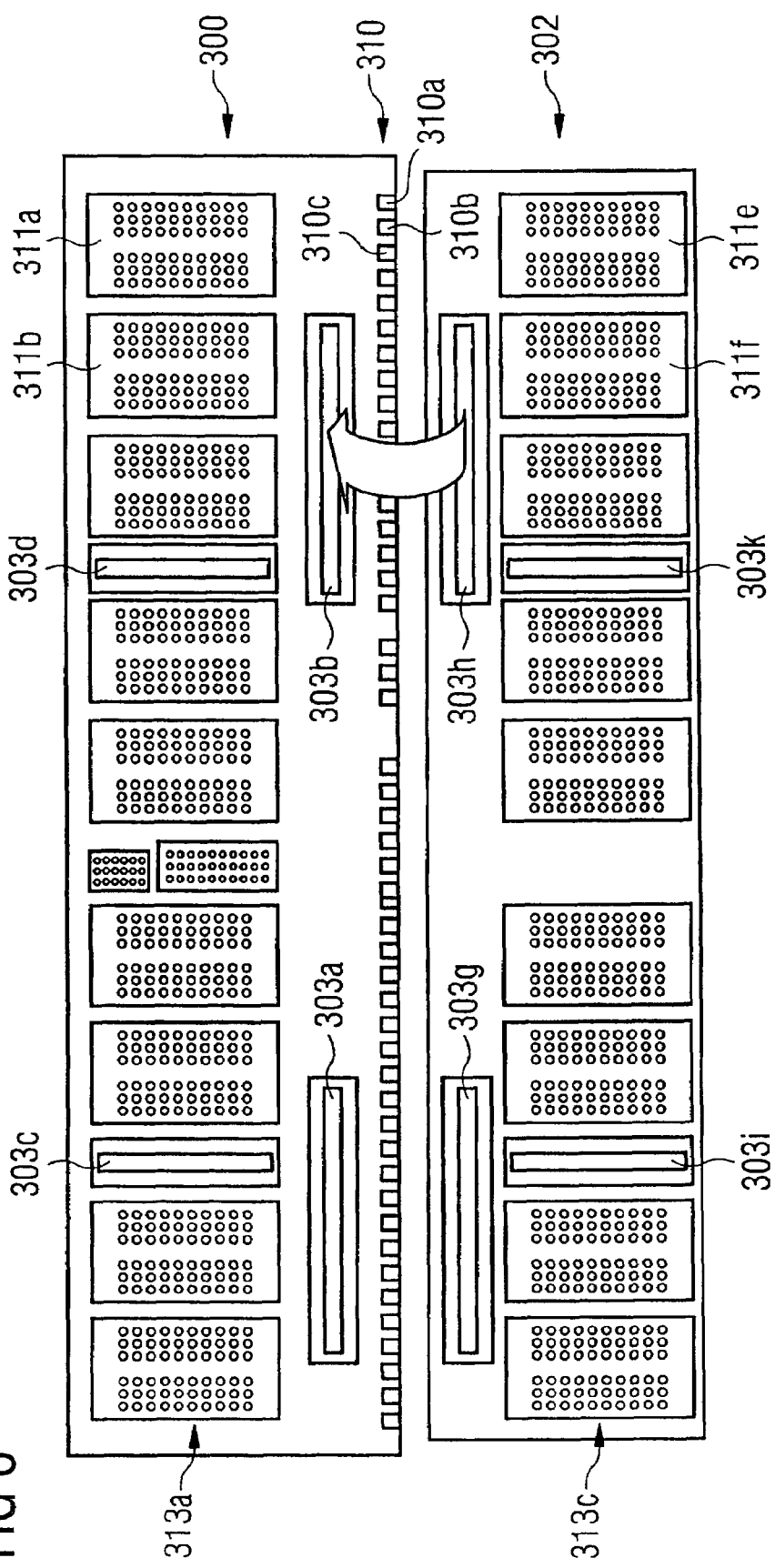
FIG. 6 illustrates a front side of a memory module, and a rear side of an extension memory module, according to a third embodiment of the invention, in a dismounted state of the extension memory module.
Figure 7:
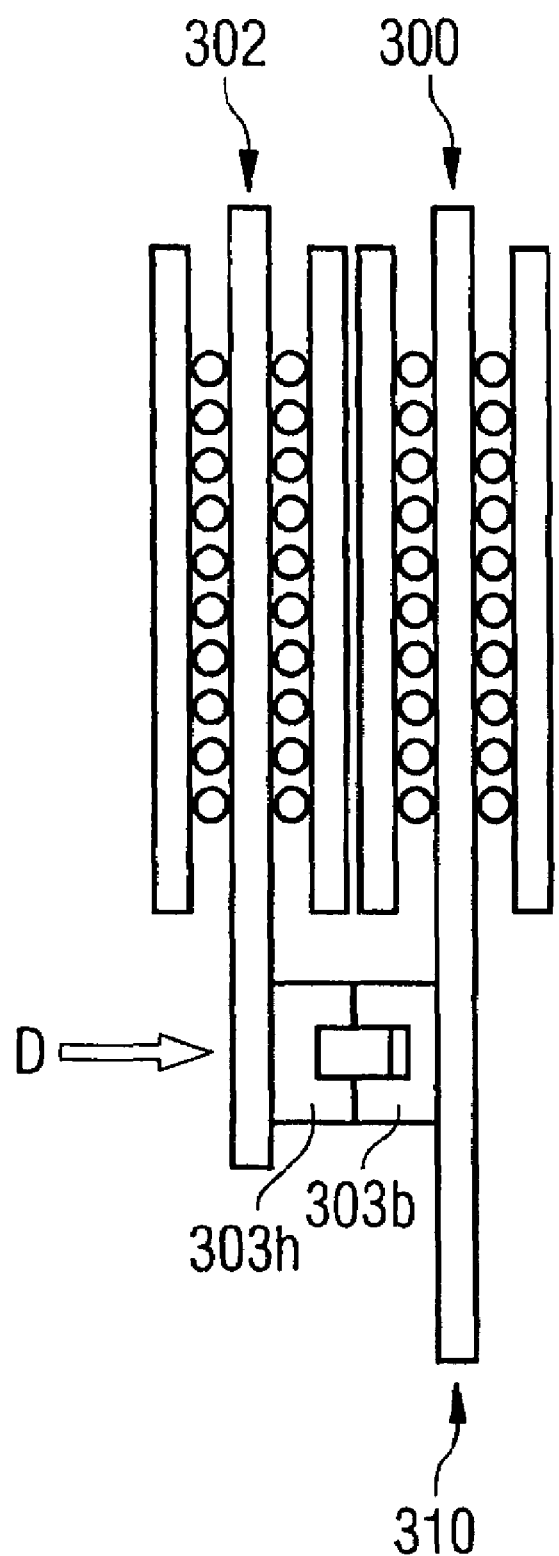
FIG. 7 illustrates a schematic lateral view of the memory modules illustrated in FIG. 6, in a mounted state of the extension memory module.

FIGS. 6 and 7 (and FIGS. 8 and 9, as well as FIGS. 10 and 11, and FIGS. 12 and 13) each illustrate further, alternative embodiments of the invention.

FIG. 6 illustrates a rear side of an extension memory module 302, and a front side of a memory module 300, according to a third, alternative embodiment of the invention. The memory module 300 may be inserted—in vertical direction from the top—into a memory module plug-in contact 3 of the motherboard 1 illustrated in FIG. 1.

The extension memory module 302 and the memory module 300 have a structure that is correspondingly similar to that of the extension memory module 202 and the memory module 200 illustrated in FIGS. 4 and 5, except that the memory devices 311a, 311b, 311e, 311f arranged at the front and rear sides of the extension memory module 302 and of the memory module 300 are not positioned side by side and on top of each other on each module side in several horizontal rows 213a, 213b, 213c, 213d that are positioned on top of each other, but—on each module side—side by side in one single, horizontal row 313a, 313c.

Furthermore, four SMT connectors 303a, 303b, 303c, 303d, or 303g, 303h, 303i, 303k, respectively, are provided each at the front side of the memory module 300 and at the rear side of the extension memory module 302 (instead of merely three SMT connectors 203a, 203b, 203c, or 203g, 203h, 203i, respectively, as with the memory modules 200, 202 illustrated in FIGS. 4 and 5), and the SMT connectors 303a, 303b, 303c, 303d, or 303g, 303h, 303i, 303k, respectively, are arranged differently from the embodiment illustrated in FIGS. 4 and 5.

As results from FIG. 6, the SMT connectors 303a, 303b of the memory module 300, or the SMT connectors 303g, 303h of the extension memory module 302, respectively, each are positioned between the respective row of memory devices 313a or 313c and the module edge that is (after the installation of the memory module or of the extension memory module 300, 302, respectively) positioned at the bottom.

Contrary to that, the SMT connectors 303c, 303d of the memory module 300, or the SMT connectors 303i, 303k of the extension memory module 302, respectively, are each positioned between two corresponding memory devices of the respective row of memory devices 313a, 313c.

As results from FIG. 6, the SMT connectors 303a, 303b, 303c, 303d, 303g, 303h, 303i, 303k each have a substantially rectangular, elongate shape.

The SMT connectors 303a, 303b of the memory module 300 and the SMT connectors 303g, 303h of the extension memory module 302 are each attached to the respective memory module 300 or 302 in horizontal orientation (so that the longitudinal axis of the SMT connectors 303a, 303b, or 303g, 303h, respectively, extends in parallel to the above-mentioned module edge that is, after the installation of the memory modules 300, 302, positioned at the bottom).

Contrary to that, the SMT connectors 303c, 303d of the memory module 300 and the SMT connectors 303i, 303k of the extension memory module 302 are each attached to the respective memory module 300 or 302 in vertical orientation (so that the longitudinal axis of the SMT connectors 303c, 303d, or 303i, 303k, respectively, extends perpendicular to the above-mentioned module edge that is, after the installation of the memory modules 300, 302, positioned at the bottom).

If the storage capacity of the memory module 300 is to be increased, the extension memory module 302 may—as is illustrated in FIG. 7—be moved—from a position at which the rear side of the extension memory module 302 and the front side of the memory module 300 are directly facing each other in parallel—in horizontal direction (arrow D) towards the memory module 300 until the SMT connectors 303g, 303h, 303i, 303k at the rear side of the extension memory module 302 engage in the corresponding SMT connectors 303a, 303b, 303c, 303d at the front side of the memory module 300. The extension memory module 302 is then electrically and mechanically connected with the memory module 300.

Figure 8:
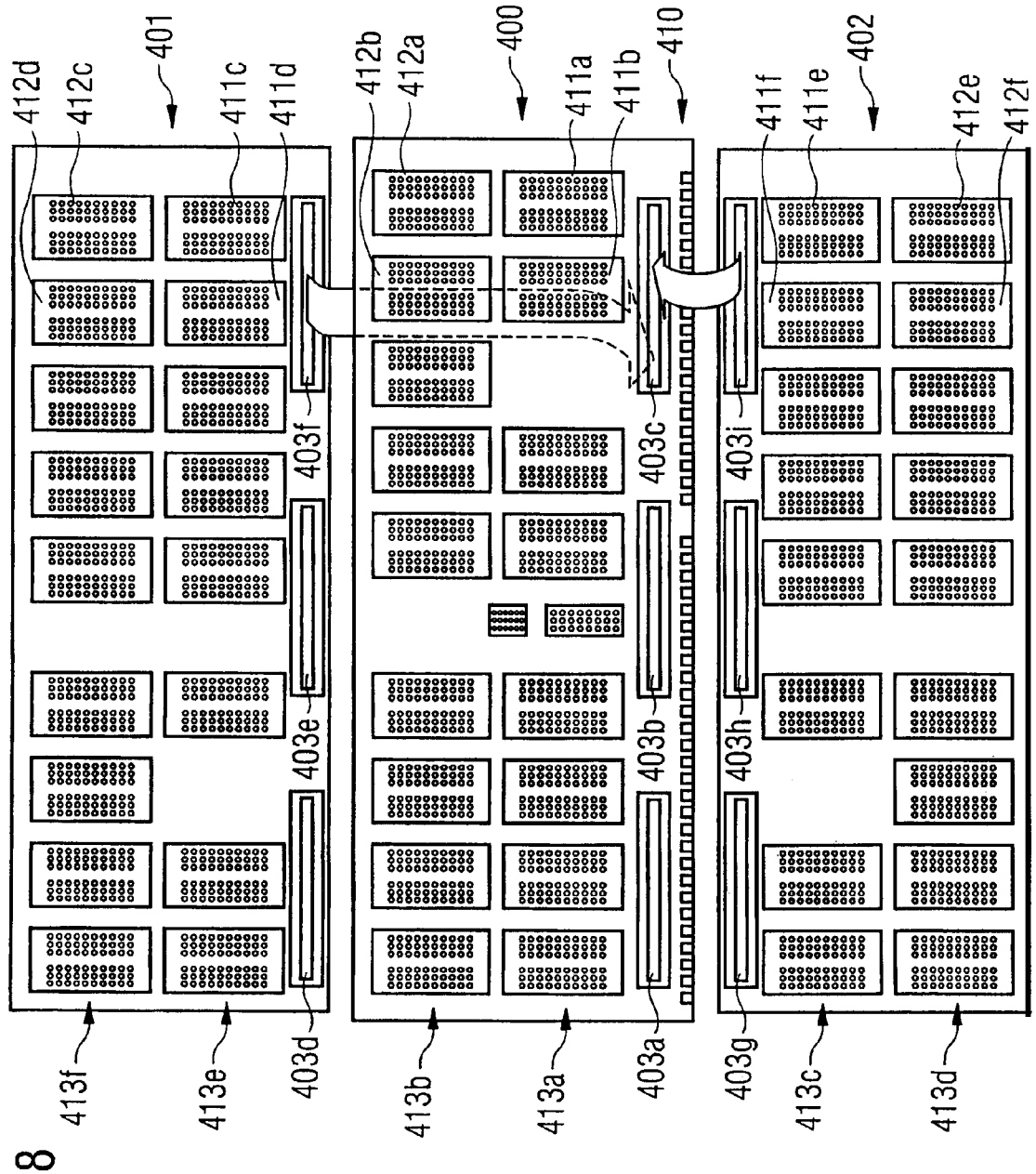
FIG. 8 illustrates a front side of a memory module, a front side of a first extension memory module, and a rear side of a second extension memory module, according to a fourth embodiment of the invention, in a dismounted state of the first and second extension memory modules.

FIG. 8 illustrates a front side of a first extension memory module 401, a rear side of a second extension memory module 402, and a front side of a memory module 400, according to a fourth, alternative embodiment of the invention. The memory module 400 may be inserted—in vertical direction from the top—into a memory module plug-in contact 3 of the motherboard 1 illustrated in FIG. 1.

The extension memory modules 401, 402 and the memory module 400 have a structure that is correspondingly similar to that of the extension memory modules 101, 102 illustrated in FIGS. 2 and 3, or to the memory module 100 illustrated in FIGS. 2 and 3, respectively, except that the memory devices 411a, 411b, 412a, 412b, 411c, 411d, 412c, 412d, 411e, 411f, 412e, 412f arranged at the front and rear sides of the memory module 400 and of the extension memory modules 401, 402 are not positioned side by side on each module side in one single, horizontal row, but side by side and on top of each other in several horizontal rows 413a, 413b, 413c, 413d, 413e, 413f that are positioned on top of each other.

Figure 9:
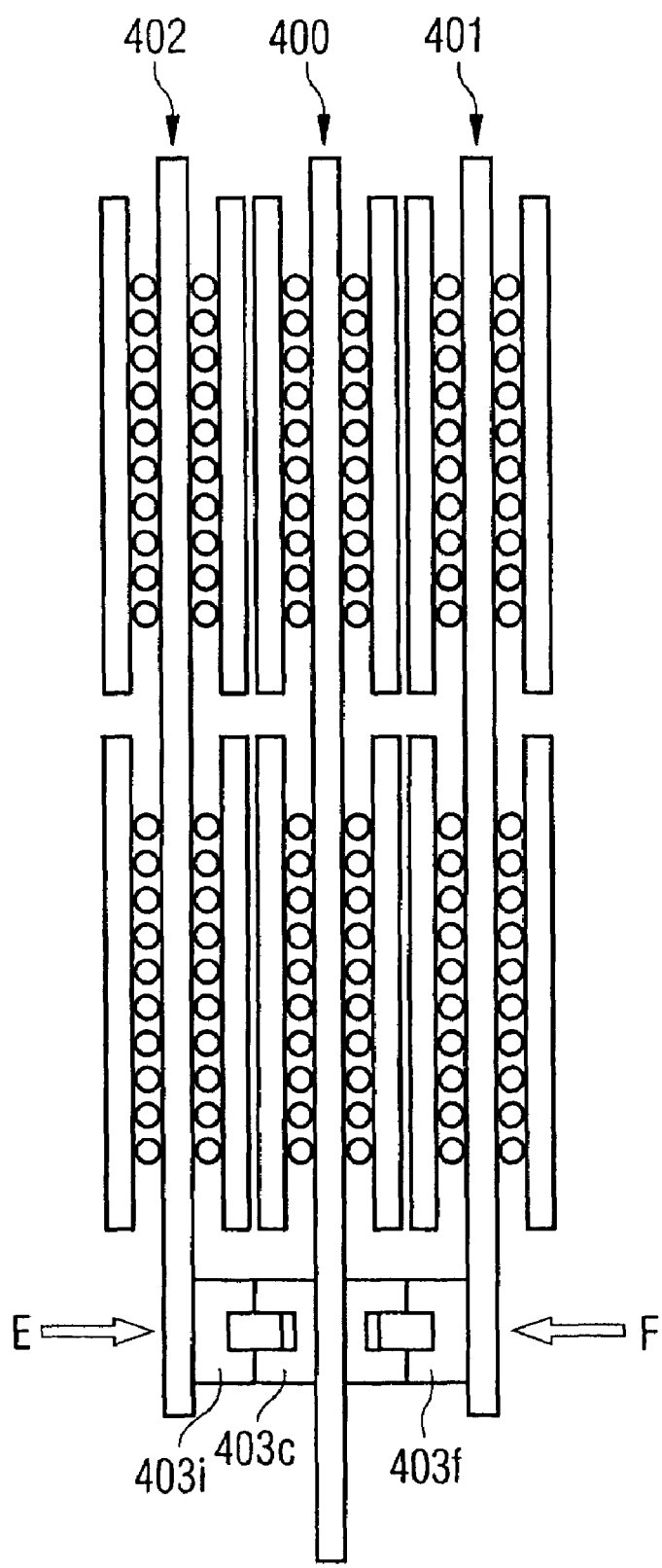
FIG. 9 illustrates a schematic lateral view of the memory modules illustrated in FIG. 8, in a mounted state of the first and second extension memory modules.

If the storage capacity of the memory module 400 is to be increased, the extension memory modules 401, 402 may—as is illustrated in FIG. 9—be moved—from a position at which the rear side of the extension memory module 402 and the front side of the memory module 400, or the front side of the extension memory module 401 and the rear side of the memory module 400, respectively, are directly facing each other in parallel—in horizontal direction (arrow E or arrow F, respectively) towards the memory module 400 until the SMT connectors 403*g*, 403*h*, 403*i* provided at the rear side of the extension memory module 402 engage in the corresponding SMT connectors 303*a*, 303*b*, 303*c* provided at the front side of the memory module 400, and the SMT connectors 403*d*, 403*e*, 403*f* provided at the front side of the extension memory module 401 engage in the corresponding SMT connectors provided at the rear side of the memory module 400. The extension memory modules 401, 402 are then electrically and mechanically connected with the memory module 400.

Figure 10:
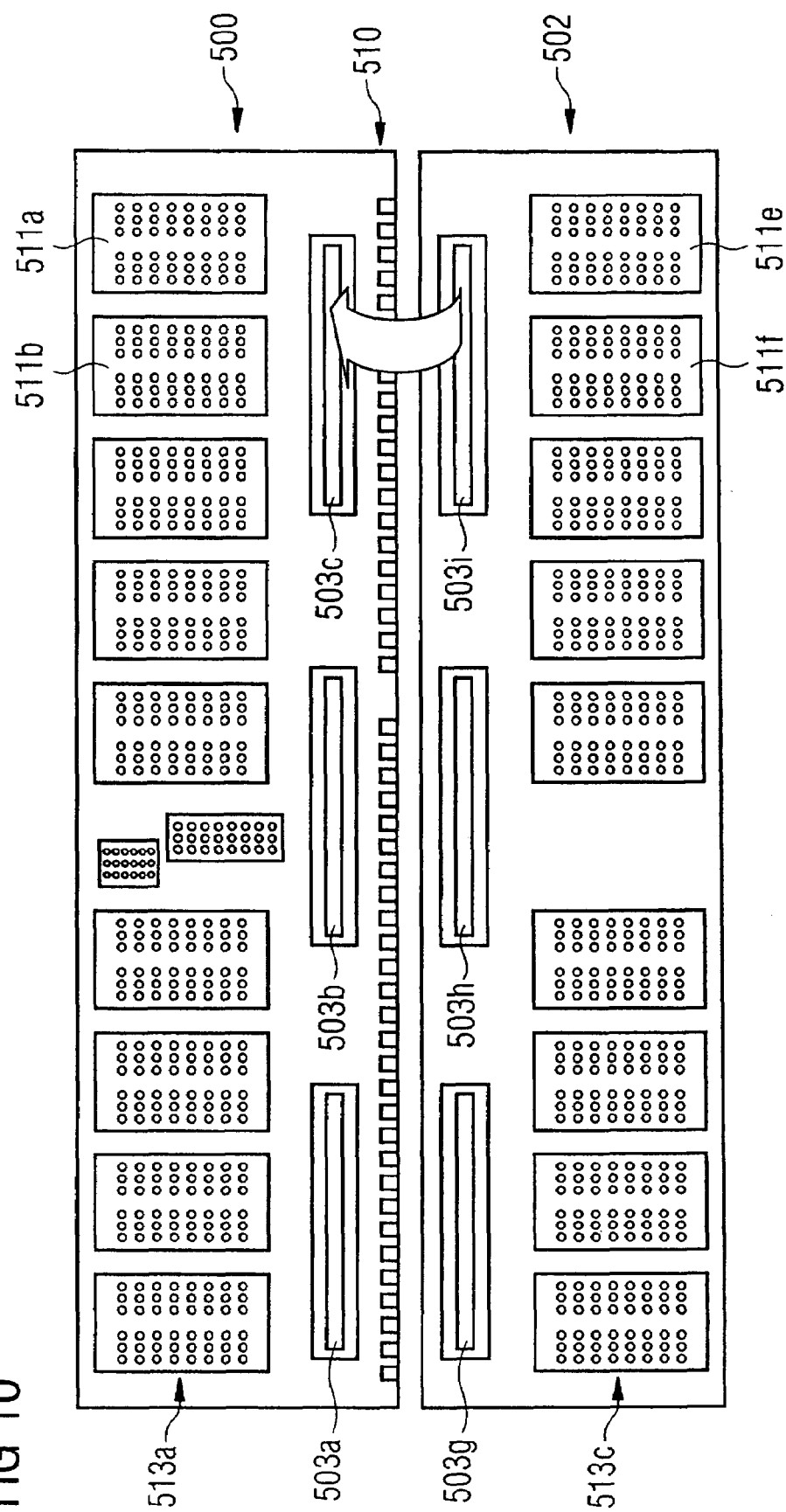
FIG. 10 illustrates a front side of a memory module, and a rear side of an extension memory module, according to a fifth embodiment of the invention, in a dismounted state of the extension memory module.

FIG. 10 illustrates a rear side of an extension memory module 502, and a front side of a memory module 500, according to a fifth, alternative embodiment of the invention. The memory module 500 may be inserted—in vertical direction from the top—into a memory module plug-in contact 3 of the motherboard 1 illustrated in FIG. 1.

The extension memory module 502 and the memory module 500 have a structure that is correspondingly similar to that of the extension memory module 202 illustrated in FIGS. 4 and 5, or to the memory module 200 illustrated in FIGS. 4 and 5, respectively, except that the memory devices 511*a*, 511*b*, 511*e*, 511*f* arranged at the front and rear sides of the memory modules 500, 502 are not positioned side by side and on top of each other on each module side in several horizontal rows 213*a*, 213*b*, 213*c*, 213*d* that are positioned on top of each other, but—on each module side—side by side in one single, horizontal row 513*a*, 513*c*.

Furthermore—other than with the embodiment illustrated in FIGS. 4 and 5—the memory devices 511*a*, 511*b*, 511*e*, 511*f*, 512*a*, 512*e* provided at the front and rear sides of the memory module 500 and of the extension memory module 502 do not all have an identically large storage capacity nor an identically large housing.

Figure 11:
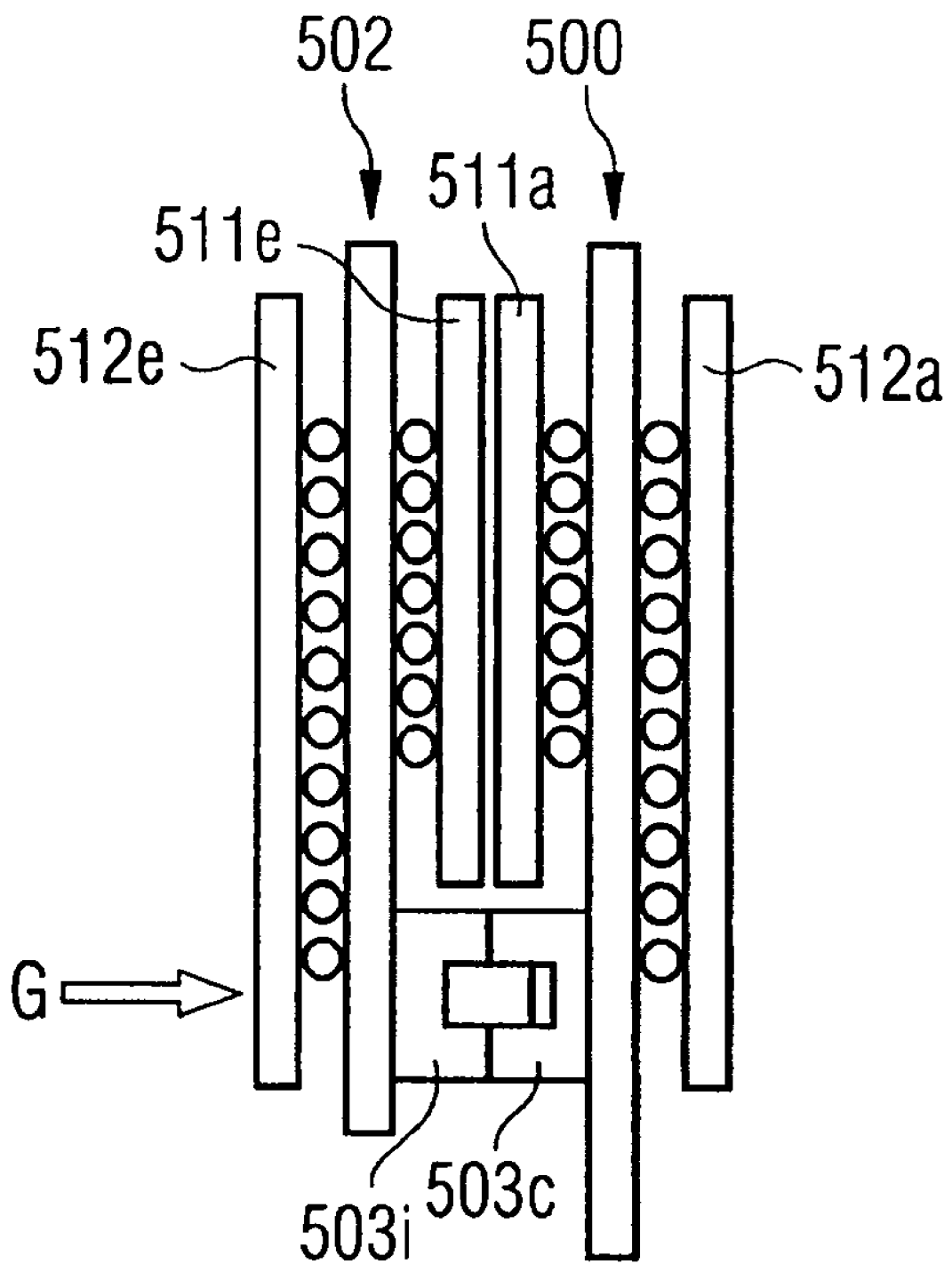
FIG. 11 illustrates a schematic lateral view of the memory modules illustrated in FIG. 10, in a mounted state of the extension memory module.

Instead—as results from FIG. 11—the memory devices 511*a*, 511*b*, 511*e*, 511*f* provided at the front side of the memory module 500 and at the rear side of the extension memory module 502 have a smaller storage capacity and are arranged in smaller housings than the memory devices 512*a*, 512*e* provided at the rear side of the memory module 500 and at the front side of the extension memory module 502. The memory devices 512*a*, 512*e* provided at the rear side of the memory module 500 and at the front side of the extension memory module 502 may, for instance, have a—e.g., respectively identical—storage capacity of, e.g., 1 GBit each, and the memory devices 511*a*, 511*b*, 511*e*, 511*f* provided at the front side of the memory module 500 and at the rear side of the extension memory module 502 may have a—e.g., respectively identical—storage capacity of, e.g., 512 MBit each.

If the storage capacity of the memory module 500 is to be increased, the extension memory module 502 may—as is illustrated in FIG. 11—be moved—from a position at which the rear side of the extension memory module 502 and the front side of the memory module 500 are directly facing each other in parallel—in horizontal direction (arrow G) towards the memory module 500 until the SMT connectors 503*g*, 503*h*, 503*i* provided at the rear side of the extension memory module 502 engage in the corresponding SMT connectors 503*a*, 503*b*, 503*c* provided at the front side of the memory module 500. The extension memory module 502 is then electrically and mechanically connected with the memory module 500.

As results from FIG. 11, after the connection of the extension memory module 502 with the memory module 500, the upper module edge of the extension memory module 502 is substantially on the same level as the upper module edge of the memory module 500, and the lower module edge of the extension memory module 502 is somewhat above the lower module edge of the memory module 500.

Furthermore, the respective lower edges of the SMT connectors 503*a*, 503*b*, 503*c* attached to the front side of the memory module 500 and of the SMT connectors 503*g*, 503*h*, 503*i* attached to the rear side of the extension memory module 502 are substantially on the same level as the respective lower edges of the memory devices 512*a* attached to the rear side of the memory module 500, and of the memory devices 512*e* attached to the front side of the extension memory module 502.

Figure 12:
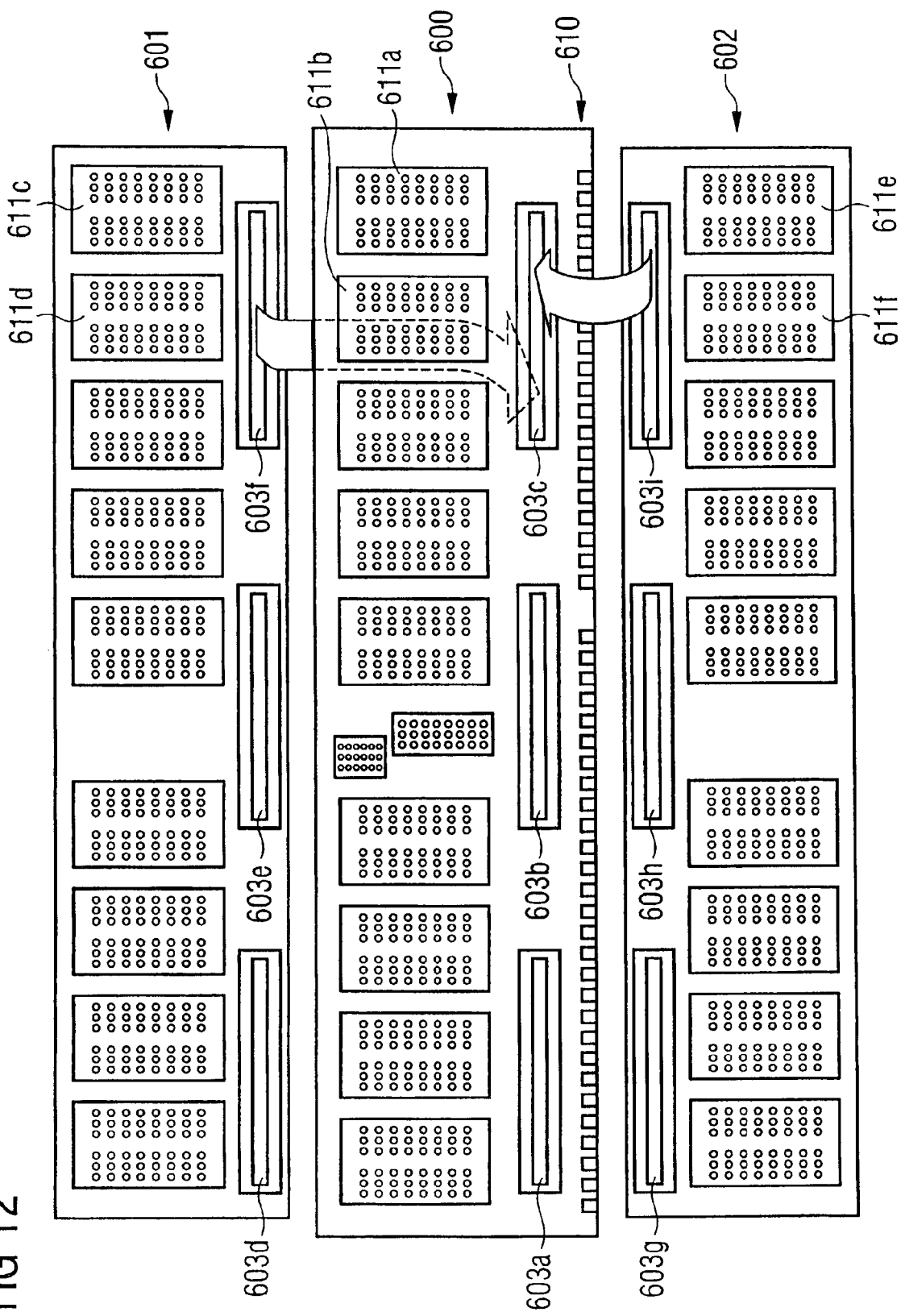
FIG. 12 illustrates a front side of a memory module, a front side of a first extension memory module, and a rear side of a second extension memory module, according to a sixth embodiment of the invention, in a dismounted state of the first and second extension memory modules.

FIG. 12 illustrates a front side of a first extension memory module 601, a rear side of a second extension memory module 602, and a front side of a memory module 600, according to a sixth, alternative embodiment of the invention. The memory module 600 can be inserted—in vertical direction from the top—into a memory module plug-in contact 3 of the motherboard 1 illustrated in FIG. 1.

The extension memory modules 601, 602 and the memory module 600 have a structure that is correspondingly similar to that of the extension memory modules 101, 102 illustrated in FIGS. 2 and 3, or of the memory module 100 illustrated in FIGS. 2 and 3, respectively.

However, other than with the embodiment illustrated in FIGS. 2 and 3, the memory devices 611*a*, 611*b*, 611*c*, 611*d*, 611*e*, 611*f*, 612*a*, 612*e* provided at the front and rear sides of the memory module 600 and of the extension memory modules 601, 602 do not all have an identically large storage capacity nor an identically large housing.

Figure 13:
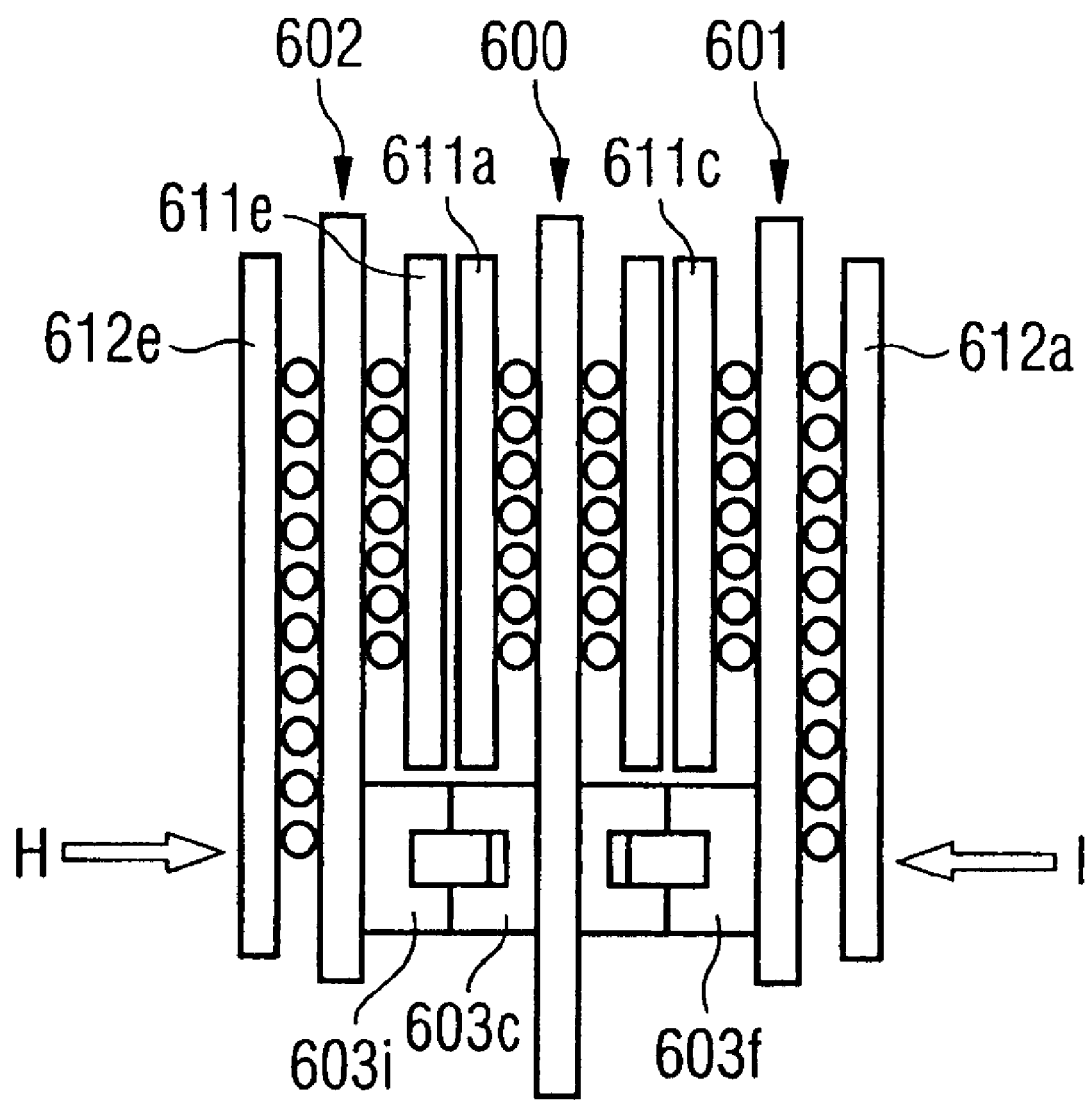
FIG. 13 illustrates a schematic lateral view of the memory modules illustrated in FIG. 12, in a mounted state of the first and second extension memory modules.

Instead—as results from FIG. 13—the memory devices 611*a*, 611*b*, 611*c*, 611*d*, 611*e*, 611*f* provided at the front and rear sides of the memory module 600, at the rear side of the extension memory module 602, and at the front side of the extension memory module 601 have a smaller storage capacity and are arranged in smaller housings than the memory devices 612*a*, 612*e* provided at the rear side of the extension memory module 601 and at the front side of the extension memory module 602. The memory devices 612*a*, 612*e* provided at the rear side of the extension memory module 601 and at the front side of the extension memory module 602 may, for instance, have a—, e.g., respectively identical—storage capacity of, e.g., 1 GBit each, and the memory devices 611*a*, 611*b*, 611*c*, 611*d*, 611*e*, 611*f* provided at the front and rear sides of the memory module 600, at the rear side of the extension memory module 602, and at the front side of the extension memory module 601 may have a—, e.g., respectively identical—storage capacity of, e.g., 512 MBit each.

If the storage capacity of the memory module 600 is to be increased, the extension memory modules 601, 602 may—as is illustrated in FIG. 13—be moved—from a position at which the rear side of the extension memory module 602 and the front side of the memory module 600, or the front side of the extension memory module 601 and the rear side of the memory module 600, respectively, are directly facing each other in parallel—in horizontal direction (arrow H, arrow I) towards the memory module 600 until the SMT connectors 603*g*, 603*h*, 603*i* provided at the rear side of the extension memory module 602 engage in the corresponding SMT connectors 603*a*, 603*b*, 603*c* provided at the front side of the memory module 600, and the SMT connectors 603*d*, 603*e*, 603f provided at the front side of the extension memory module 601 engage in the corresponding SMT connectors at the rear side of the memory module 600. The extension memory modules 601, 602 are then electrically and mechanically connected with the memory module 600.

As results from FIG. 13, after the connection of the extension memory modules 601, 602 with the memory module 600, the respective upper module edge of the extension memory modules 601, 602 is substantially on the same level as the upper module edge of the memory module 600, and the respective lower module edge of the extension memory modules 601, 602 is somewhat above the lower module edge of the memory module 600.

Furthermore, the respective lower edges of the SMT connectors 603a, 603b, 603c attached to the front and rear sides of the memory module 600, of the SMT connectors 603g, 603h, 603i attached to the rear side of the extension memory module 602, and of the SMT connectors 603d, 603e, 603f attached to the front side of the extension memory module 601 are substantially on the same level as the respective lower edges of the memory devices 612a attached to the rear side of the extension memory module 601, and of the memory devices 612e attached to the front side of the extension memory module 602.

On the above-mentioned memory modules 100, 200, 300, 400, 500, 600 (or, alternatively: both on the above-mentioned memory modules 100, 200, 300, 400, 500, 600 and on the above-mentioned extension memory modules 101, 102, 202, 302, 401, 402, 502, 601, 602), an EPROM device (EPROM=Erasable Programmable Read Only Memory) may be provided in addition to the above-mentioned DRAM memory devices.

On the EPROM devices, data are stored which are read out by the CPU 2 provided on the motherboard 1, or by the memory controller assigned thereto, respectively, during the booting of the computer, and which signalize to the CPU 2 which DRAM memory devices are available in the system and how they are to be addressed.

It is thus possible that, by means of the CPU 2, data can be stored in any of the DRAM memory devices provided on the memory modules 100, 200, 300, 400, 500, 600 or the extension memory modules 101, 102, 202, 302, 401, 402, 502, 601, 602, and can be read out again later.

Instead for PCs (Personal Computers), as has been explained here by way of example, the above-mentioned or correspondingly similarly structured memory modules 100, 200, 300, 400, 500, 600 and pertinent extension memory modules 101, 102, 202, 302, 401, 402, 502, 601, 602 may, for instance, also be used for laptops, notebooks, workstation computers, server computers, or any other kinds of electrical or electronic devices.

FIG. 14 illustrates, by way of example, a flowchart for illustrating method processes that are performed during the manufacturing of the memory modules 100, 200, 300, 400, 500, 600 or extension memory module 101, 102, 202, 302, 401, 402, 502, 601, 602 illustrated in FIGS. 2 to 13 (here: by the example of the memory module 100 illustrated in FIGS. 2 and 3).

In a first process I, the SMT connectors 103a, 103b, 103c and DRAM memory devices 111a, 111b that are to be attached to the front side of the memory module 100 are placed on the surface of the front side of the memory module 100 such that the contacts provided at the SMT connectors 103a, 103b, 103c and at the DRAM memory devices 111a, 111b contact the corresponding contacts provided on the surface of the front side of the memory module 100—or in more detail a soldering paste provided thereon.

Subsequently, the memory module 100 is turned over. Then, the SMT connectors and DRAM memory devices that are to be attached to the rear side of the memory module 100 are placed on the surface of the rear side of the memory module 100 (so that the contacts provided at the respective SMT connectors and DRAM memory devices contact the corresponding contacts provided on the surface of the rear side of the memory module 100—or in more detail a soldering paste provided thereon).

In a next process II the memory module 100 is heated in an oven. In so doing, both the above-mentioned contacts of the SMT connectors 103a, 103b, 103c and the above-mentioned contacts of the DRAM memory devices 111a, 111b are soldered with the respectively corresponding contacts provided on the surface of the front side and the rear side of the memory module 100.

In other words, the SMT connectors 103a, 103b, 103c and the DRAM memory devices 111a, 111b are electrically and mechanically connected to the front side and the back side of the memory module 100 in a—single—joint surface-mounting step.

Hence, the total production costs may be kept low.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory module comprising:
   a connector for connecting the memory module to a computer system;
   at least one memory device; and
   a surface-mounted connector for connecting a memory extension memory module to the memory module,
   wherein a contact of the connector is connected with a plurality of contacts of the surface-mounted connector.

2. The memory module according to claim 1, the memory module additionally comprising a further surface-mounted connector for connecting a further memory extension memory module to the memory module.

3. The memory module according to claim 1, wherein the surface-mounted connector is connected to a front side of the memory module.

4. The memory module according to claim 2, wherein the further surface-mounted connector is connected to a rear side of the memory module.

5. The memory module according to claim 1, wherein the surface-mounted connector is connected to a rear side of the memory module.

6. The memory module according to claim 2, wherein the further surface-mounted connector is connected to a front side of the memory module.

7. The memory module according to claim 3, the memory module comprising:
   a plurality of surface-mounted connectors that are connected to the front side of the memory module.

8. The memory module according to claim 5, the memory module comprising:
   a plurality of surface-mounted connectors that are connected to the rear side of the memory module.

9. The memory module according to claim 1, wherein the surface-mounted connector is a MEZZANINE connector.

10. The memory module according to claim 2, wherein the further surface-mounted connector is a MEZZANINE connector.

11. The memory module according to claim 1, the memory module additionally comprising:
a connector for connecting the memory module to a computer system.

12. The memory module according to claim 11, wherein the connector for connecting the memory module to the computer system is an edge connector.

13. The memory module according to claim 12, wherein the edge connector is a DIMM memory card edge connector.

14. The memory module according to claim 12, wherein the edge connector is a SIMM memory card edge connector.

15. The memory module according to claim 1, the memory module comprising a plurality of memory devices that are positioned side by side in at least one row.

16. The memory module according to claim 15, wherein the surface-mounted connector is positioned between the at least one row of memory devices and a connector for connecting the memory module to a computer system.

17. The memory module according to claim 15, wherein the surface-mounted connector is positioned between the memory devices of the at least one row of memory devices.

18. The memory module according to claim 12, wherein the surface-mounted connector has an elongate shape, and wherein the longitudinal axis of the surface-mounted connector extends in parallel to the module edge at which the edge connector is provided.

19. The memory module according to claim 12, wherein the surface-mounted connector has an elongate shape, and wherein the longitudinal axis of the surface-mounted connector extends perpendicular to the module edge at which the edge connector is provided.

20. The memory module according to claim 1, wherein the at least one memory device is a DRAM memory device.

21. The memory module according to claim 20, wherein the at least one memory device is a stacked DRAM.

22. The memory module according to claim 1, wherein the at least one memory device is arranged in a surface-mounted housing.

23. The memory module according to claim 1, the memory module comprising:
a plurality of memory devices that are arranged at the front and rear sides of the memory module.

24. The memory module according to claim 23, wherein the size of the memory devices that are arranged at the front side of the memory module is the same as the size of the memory devices that are arranged at the rear side of the memory module.

25. The memory module according to claim 23, wherein the memory devices that are arranged at the front side of the memory module and the memory devices that are arranged at the rear side of the memory module are of different sizes.

26. The memory module according to claim 1, the memory module additionally comprising:
an EPROM for registering the memory module in a computer system.

27. A memory module system comprising:
at least one memory module having a connector for connecting the memory module to a computer system; and
at least one memory extension memory module, wherein the memory module and the memory extension memory module each comprise at least one surface-mounted connector, and wherein the memory extension memory module is connected to the memory module via the at least one surface-mounted connector of the memory extension memory module and the at least one surface-mounted connector of the memory module, and wherein a contact of the connector is connected with a plurality of contacts of the surface-mounted connector.

28. The memory module system according to claim 27, wherein the memory extension memory module is connected to the memory module directly and without any cable via the at least one surface-mounted connectors of the memory extension memory module and the memory module.

29. A memory module comprising:
a connector for connecting the memory module to a computer system;
at least one memory device; and
at least one surface-mounted connector, wherein the at least one memory device and the at least one surface-mounted connector are connected to the memory module in a single manufacturing step, and
wherein a contact of the connector is connected with a plurality of contacts of the surface-mounted connector.

30. The memory module according to claim 29, wherein the at least one connector is a surface-mounted connector, and the at least one memory device is a surface-mounted memory device.

31. A memory module comprising:
first means for connecting the memory module to a computer system;
at least one memory device; and
second means for connecting a memory extension memory module to the memory module.

* * * * *